(12) United States Patent
Lee et al.

(10) Patent No.: US 9,508,649 B2
(45) Date of Patent: Nov. 29, 2016

(54) SEMICONDUCTOR DEVICES

(71) Applicant: Samsung Electronics Co., Ltd., Suwon-si, Gyeonggi-do (KR)

(72) Inventors: Hyeon-Kyu Lee, Suwon-si (KR); Sunghee Han, Hwaseong-si (KR); Yoosang Hwang, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/991,020

(22) Filed: Jan. 8, 2016

(65) Prior Publication Data

US 2016/0211215 A1  Jul. 21, 2016

(30) Foreign Application Priority Data

Jan. 21, 2015  (KR) .................. 10-2015-0010037

(51) Int. Cl.
| | |
|---|---|
| *H01L 23/532* | (2006.01) |
| *H01L 29/78* | (2006.01) |
| *H01L 29/423* | (2006.01) |
| *H01L 23/528* | (2006.01) |

(52) U.S. Cl.
CPC ......... *H01L 23/5329* (2013.01); *H01L 23/528* (2013.01); *H01L 29/4236* (2013.01); *H01L 29/7827* (2013.01)

(58) Field of Classification Search
CPC .......... H01L 23/5329; H01L 29/4236; H01L 23/528; H01L 29/7827
See application file for complete search history.

(56) References Cited

U.S. PATENT DOCUMENTS

| | | | |
|---|---|---|---|
| 6,362,073 B2 | 3/2002 | Kim | |
| 6,492,245 B1 | 12/2002 | Liu et al. | |
| 9,356,073 B1* | 5/2016 | Kim | ................... H01L 27/2436 |
| 2013/0328199 A1 | 12/2013 | Yun et al. | |
| 2014/0179101 A1 | 6/2014 | Lee et al. | |

FOREIGN PATENT DOCUMENTS

KR    1020140055183    5/2014

* cited by examiner

*Primary Examiner* — Roy Potter
*Assistant Examiner* — Paul Patton
(74) *Attorney, Agent, or Firm* — Myers Bigel, P.A.

(57) ABSTRACT

Semiconductor devices are provided. The semiconductor devices may include a first interconnection structure and a second interconnection structure which are disposed on a semiconductor substrate. A contact structure may be disposed between the first and second interconnection structures. A first lower air spacer may be disposed between the first interconnection structure and the contact structure. A second lower air spacer may be disposed between the second interconnection structure and the contact structure to be spaced apart from the first lower air spacer. An upper air spacer may be disposed on side surfaces of the contact structure to be connected to the first and second interconnection structures.

20 Claims, 20 Drawing Sheets

SEMICONDUCTOR DEVICES

CROSS-REFERENCE TO RELATED APPLICATION

This application claims priority under 35 U.S.C. §119 to Korean Patent Application No. 10-2015-0010037, filed on Jan. 21, 2015, the disclosure of which is hereby incorporated by reference in its entirety.

BACKGROUND

Example embodiments of the inventive concepts relate to semiconductor devices, methods of forming the semiconductor devices, and an electronic system including the semiconductor devices.

As the degree of integration of semiconductor devices increases, a distance between adjacent conductive patterns is reduced, a cross talk between the adjacent conductive patterns may occur, and a parasitic capacitance between the adjacent conductive patterns that are electrically separated by an insulating layer may be increased. For example, if the conductive patterns are bit lines of a memory device, a parasitic capacitance between the bit lines may impede the flow of electrical signals and may reduce a bit line sensing margin. Therefore, in order to reduce the parasitic capacitance between the adjacent conductive patterns, a spacer having a lower dielectric constant may be formed between the conductive patterns.

SUMMARY

In accordance with example embodiments of the inventive concepts, a semiconductor device includes a first interconnection structure and a second interconnection structure which are disposed on a semiconductor substrate. A contact structure is disposed between the first and second interconnection structures. A first lower air spacer is disposed between the first interconnection structure and the contact structure. A second lower air spacer is disposed between the second interconnection structure and the contact structure to be spaced apart from the first lower air spacer. An upper air spacer is disposed on side surfaces of the contact structure to be connected to the first and second interconnection structures.

In example embodiments, the device may further include a first insulating pattern and a second insulating pattern which are disposed between the first and second interconnection structures.

In example embodiments, the upper air spacer may include a first part, a second part, a third part, and a fourth part, and the first part of the upper air spacer is disposed between the first interconnection structure and the contact structure and on the first lower air spacer, the second part of the upper air spacer is disposed between the second interconnection structure and the contact structure and on the second lower air spacer, the third part of the upper air spacer is disposed between the first insulating pattern and the contact structure, and the fourth part of the upper air spacer is disposed between the second insulating pattern and the contact structure.

In example embodiments, the first part of the upper air spacer may have a height different from the second part of the upper air spacer.

In example embodiments, the third and fourth parts of the upper air spacer may have heights greater than the first part of the upper air spacer.

In example embodiments, the first and second lower air spacers may have line shapes in parallel and the upper air spacer may have a ring shape which surrounds a part of a side surface of the contact structure.

In example embodiments, the contact structure may include a lower contact pattern and an upper contact pattern disposed on the lower contact pattern.

In example embodiments, the first lower air spacer may be disposed between the lower contact pattern of the contact structure and the first interconnection structure, and the second lower air spacer may be disposed between the lower contact pattern of the contact structure and the second interconnection structure.

In example embodiments, the upper air spacer may surround a side surface of a part of the upper contact pattern.

In example embodiments, the device may further include an upper spacer layer disposed between the upper air spacer and the upper contact pattern.

In accordance with another embodiment of the inventive concepts, a semiconductor device includes a first interconnection structure and a second interconnection structure, which are disposed on a semiconductor substrate and spaced apart from each other. Insulating patterns are disposed to be disposed between the first and second interconnection structures and to be spaced apart from each other. A contact structure is disposed to be disposed between the first and second interconnection structures and between the insulating patterns. A first lower air spacer including a first part disposed between the first interconnection structure and the contact structure and a second part disposed between the insulating patterns and the first interconnection structure is disposed. A second lower air spacer including a first part disposed between the second interconnection structure and the contact structure and a second part disposed between the insulating patterns and the second interconnection structure is disposed. An upper air spacer is disposed on the first parts of the first and second lower air spacers. The upper air spacer surrounds a part of a side surface of the contact structure.

In example embodiments, the upper air spacer may be connected to the first part of the first lower air spacer and the first part of the second lower air spacer.

In example embodiments, each of the first and second lower air spacers may have a width greater than the upper air spacer.

In example embodiments, the first parts of the first and second lower air spacers may have heights different from the second parts of the first and second lower air spacers.

In example embodiments, the insulating patterns may have a part which overlaps the second parts of the first and second lower air spacers.

In accordance with still another embodiment of the inventive concepts, a semiconductor device includes a first interconnection structure and a second interconnection structure, and insulating patterns disposed between the first and second interconnection structures. A contact structure is disposed between the first and second interconnection structures and between the insulating patterns. A first lower air spacer is disposed between the first interconnection structure and the contact structure. A second lower air spacer is disposed between the second interconnection structure and the contact structure to be spaced apart from first lower air spacer. An upper air spacer is disposed between the first and second interconnection structures and the contact structure and between the insulating patterns and the contact structure.

In example embodiments, the device may further include a first spacer layer which is disposed between the first interconnection structure and the first lower air spacer and extends between the first interconnection structure and the upper air spacer and a second spacer layer disposed between the first lower air spacer and the contact structure, and the first and second spacer layers may be formed using an insulating material which has permittivity higher than air and includes nitrogen.

In example embodiments, the device may further include an upper spacer layer disposed between the upper air spacer and the contact structure.

In example embodiments, each of the first and second interconnection structures may include a conductive structure and an insulating capping pattern disposed on the conductive structure, and the contact structure may include a lower contact pattern, an intermediate contact pattern disposed on the lower contact pattern, and an upper contact pattern disposed on the intermediate contact pattern. The lower contact pattern and the intermediate contact pattern may be disposed between the first and second interconnection structures. The upper contact pattern may include a lower part, an intermediate part disposed on the lower part, and an upper part disposed on the intermediate part, and the lower part of the upper contact pattern may be electrically connected to the intermediate contact pattern, the intermediate part of the upper contact pattern may have a width smaller than the lower part of the upper contact pattern, and the upper part of the upper contact pattern may be spaced apart from the first interconnection structure and may overlap the insulating capping pattern of the second interconnection structure.

In example embodiments, the device may further include a semiconductor substrate, an isolation region which is disposed in the semiconductor substrate and defines an active region, a gate electrode buried in the active region and the isolation region, a gate dielectric disposed between the active region and the gate electrode, a gate capping pattern disposed on the gate electrode, a first source/drain region and a second source/drain region which are disposed in the active region on both sides of the gate capping pattern, and an interlayer insulating layer disposed on the active region, the isolation region, and the gate capping pattern. The first and second interconnection structures may be disposed on the interlayer insulating layer, one of the first and second interconnection structures may pass through the interlayer insulating layer and may include an interconnection contact pattern electrically connected to the first source/drain region, and the contact structure may be electrically connected to the second source/drain region.

Details of other embodiments are included in detailed explanations and the drawings.

BRIEF DESCRIPTION OF THE DRAWINGS

The foregoing and other features and advantages of the inventive concepts will be apparent from the more particular description of example embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION

Figure 1:
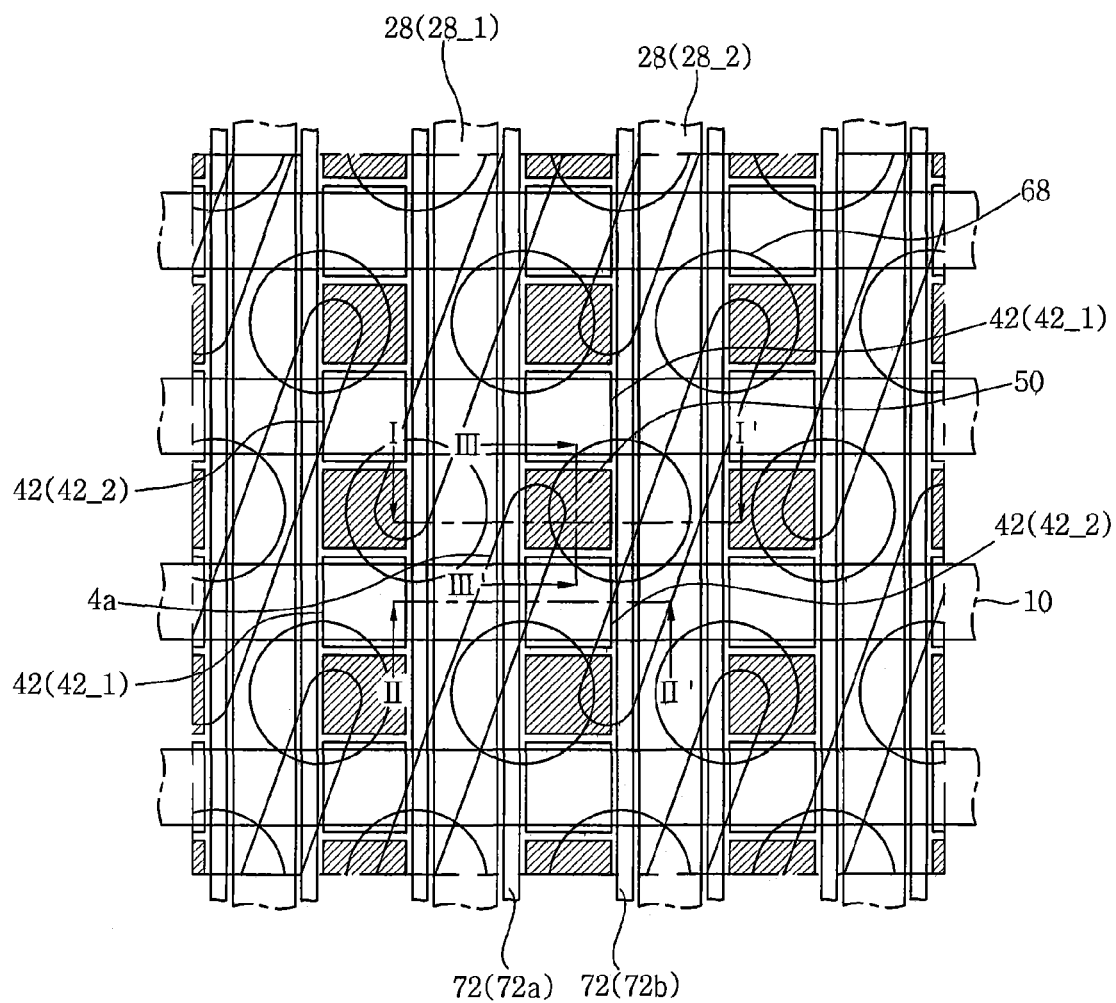
FIG. 1 is a plan view of a semiconductor device according to example embodiments of the inventive concepts.

The inventive concepts may, however, be embodied in various different forms, and should be construed as limited, not by example embodiments set forth herein, but only by the accompanying claims. Rather, these example embodiments are provided so that this disclosure is thorough and complete and fully conveys the inventive concepts to those skilled in the art. In the drawings, the sizes and relative sizes of layers and regions may be exaggerated for clarity. The same reference symbols denote the same components throughout the disclosure.

Example embodiments are described herein with reference to cross-sectional views, plan views, and/or block diagrams that are schematic illustrations of idealized example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Therefore, regions illustrated in the drawings are schematic in nature, and their shapes are not intended to limit the inventive concepts but only to illustrate characteristic forms of regions of devices.

Further, it will be understood that when a layer is referred to as being "on" another layer or a substrate, the layer may be formed directly on the other layer or the substrate, or there may be an intervening layer therebetween. As used herein the term "and/or" includes any and all combinations of one or more of the associated listed items.

Throughout this disclosure, the term "air spacer" may refer to as a spacer of empty space that is not filled with a solid material.

Terms such as "top," "bottom," "upper," "lower," "above," "below," and the like are used herein to describe the relative positions of elements or features. It will be understood that such descriptions are intended to encompass different orientations in use or operation in addition to orientations depicted in the drawings. For example, when an upper part of a drawing is referred to as a "top" and a lower part of a drawing as a "bottom" for the sake of convenience, in practice, the "top" may also be called a "bottom" and the "bottom" may also be called a "top" without departing from the teachings of the inventive concepts.

Furthermore, throughout this disclosure, directional terms such as "upper," "intermediate," "lower," and the like may be used herein to describe the relationship of one element or feature with another, and the inventive concepts should not be limited by these terms. Accordingly, these terms such as "upper," "intermediate," "lower," and the like may be replaced by other terms such as "first," "second," "third," and the like to describe the elements and features.

It will be understood that, although the terms "first," "second," etc. may be used herein to describe various elements, these elements should not be limited by these terms. These terms are only used to distinguish one element from another. Thus, a first element could be termed a second element without departing from the teachings of the inventive concepts.

The terminology used herein to describe example embodiments is not intended to limit the scope of the inventive concepts.

As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
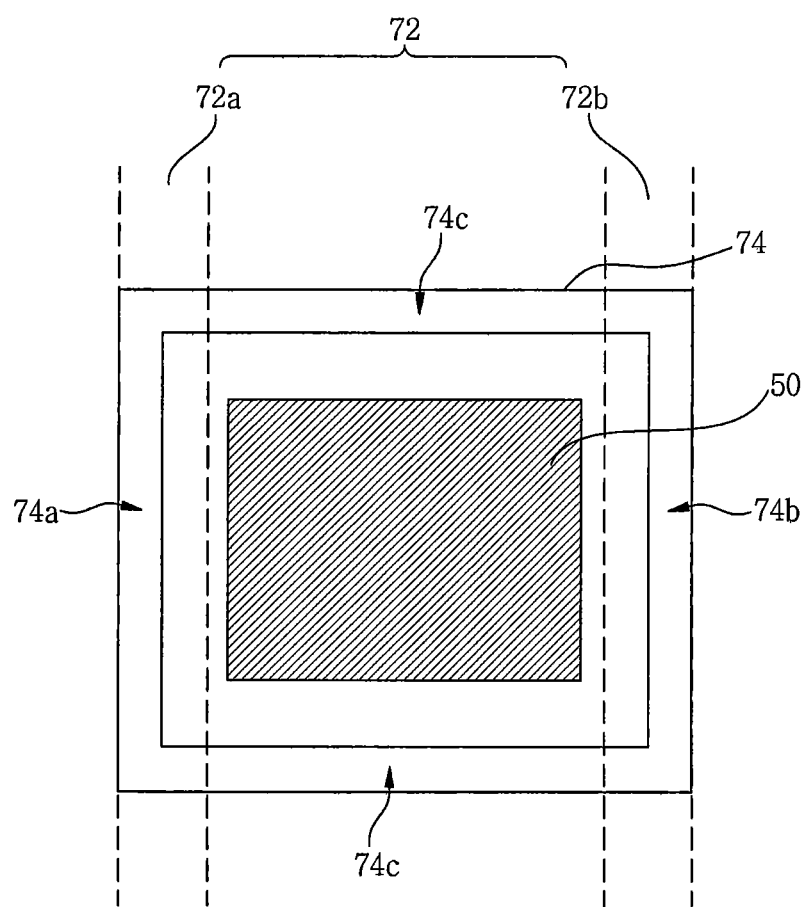
FIG. 2 is a plan view of some components of FIG. 1.
Figure 3:
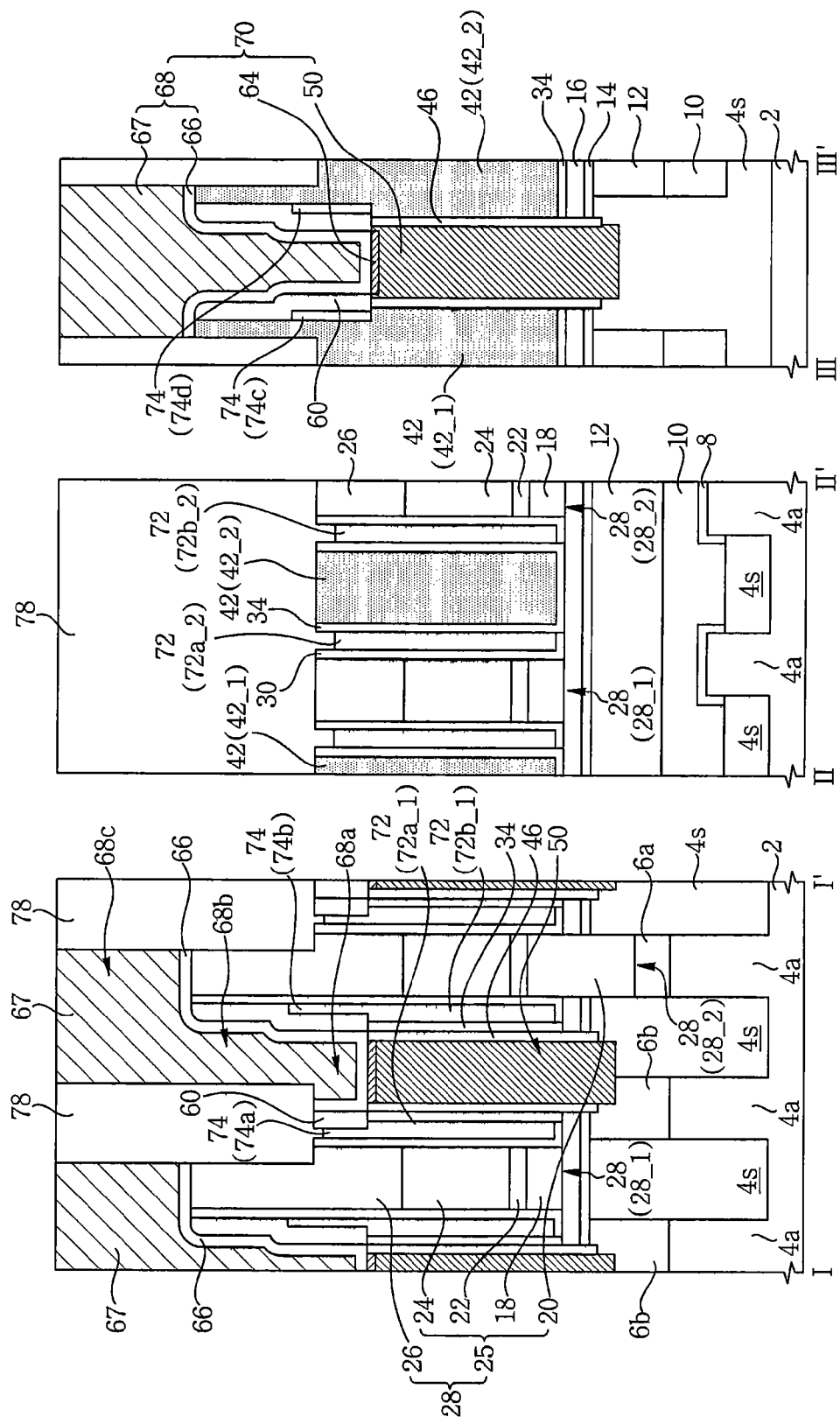
FIG. 3 is a cross-sectional view of a semiconductor device according to example embodiments of the inventive concepts.

FIG. 1 is a plan view of a semiconductor device according to example embodiments of the inventive concepts, FIG. 2 is a plan view of some components of FIG. 1, and FIG. 3 is a cross-sectional view of a semiconductor device according to example embodiments of the inventive concepts. FIG. 3 shows cross-sectional views of areas taken along lines I-I', II-II', and III-III' of FIG. 1.

Referring to FIGS. 1, 2, and 3, a semiconductor substrate 2 may be provided. The semiconductor substrate 2 may be formed using a semiconductor material such as single crystalline silicon, etc. An isolation region 4s which defines an active region 4a may be disposed in the semiconductor substrate 2. The isolation region 4s may be a shallow trench isolation layer.

Cell transistors may be disposed in the semiconductor substrate 2. Each of the cell transistors may include a gate dielectric film 8, a gate electrode 10, a first source/drain region 6a, and a second source/drain region 6b. The gate electrode 10 may be formed in a gate trench which crosses the active region 4a and extends into the isolation region 4s. The gate electrode 10 may be disposed at a level lower than an upper surface of the active region 4a. The gate electrode 10 may be buried in the active region 4a and the isolation region 4s. The gate electrode 10 may be a word line of a memory device such as a DRAM, etc. The gate dielectric film 8 may be interposed between the gate electrode 10 and the active region 4a. The first and second source/drain regions 6a and 6b may be disposed in the active region 4a on both sides of the gate electrode 10. An insulating gate capping pattern 12 may be disposed on the gate electrode 10.

A first interlayer insulating layer 14 and a second interlayer insulating layer 16 may be sequentially disposed on the substrate 2 including the cell transistors and the insulating gate capping pattern 12. The second interlayer insulating layer 16 may be formed using a material having an etch selectivity with respect to the first interlayer insulating layer 14.

Interconnection structures 28 may be disposed on the second interlayer insulating layer 16. In the memory device such as a DRAM, or the like, the interconnection structures 28 may be bit line structures.

The interconnection structures 28 may include a first interconnection structure 28_1 and a second interconnection structure 28_2 which are adjacent and parallel to each other. The interconnection structures 28 may have a part that overlaps the active region 4a and a part that does not overlap the active region 4a. Each of the interconnection structures 28 may include a conductive structure 25 and an insulating capping pattern 26 which are sequentially stacked. The insulating capping pattern 26 may be formed of, for example, silicon nitride. The conductive structure 25 may include an interconnection lower pattern 18, an interconnection contact pattern 20, an interconnection intermediate pattern 22, and an interconnection upper pattern 24. The interconnection contact pattern 20 may pass through the interconnection lower pattern 18 and be electrically connected to the first source/drain region 6a. The interconnection contact pattern 20 may be disposed on a part of the interconnection structures 28 which overlaps the active region 4a. The interconnection contact pattern 20 and the interconnection lower pattern 18 may be formed of, for example, polysilicon. The interconnection intermediate pattern 22 may be disposed on the interconnection contact pattern 20 and the interconnection lower pattern 18 and formed of, for example, a metal silicide (e.g., tungsten silicide, or the like) and/or a metal nitride (e.g., TiN, WN, or the like). The interconnection upper pattern 24 may be disposed on the interconnection intermediate pattern 22 and formed using, for example, a metal material (e.g., tungsten, or the like).

Insulating patterns 42 may be interposed between the interconnection structures 28. The insulating patterns 42 may include a first insulating pattern 42_1 and a second insulating pattern 42_2 which are spaced apart from each other and interposed between the interconnection structures 28.

Contact structures 70 including parts interposed between the interconnection structures 28 and between the insulating patterns 42 may be disposed. Each of the contact structures 70 may include a lower contact pattern 50, an upper contact pattern 68 on the lower contact pattern 50, and an intermediate contact pattern 64 between the lower contact pattern 50 and the upper contact pattern 68.

One contact structure which is selected from the contact structures 70, interposed between the first and second interconnection structures 28_1 and 28_2, and interposed between the first and second insulating patterns 42_1 and 42_2 located between the first and second interconnection structures 28_1 and 28_2 will be mainly described for convenience of descriptions.

The lower contact pattern 50 may be electrically connected to the second source/drain region 6b. The lower contact pattern 50 may be formed of, for example, silicon. The lower contact pattern 50 may be formed of, for example, doped polysilicon. The lower contact pattern 50 may be interposed between the conductive structures 25 of the interconnection structures 28 and between the insulating patterns 42. The intermediate contact pattern 64 may be formed of, for example, a metal silicide.

The upper contact pattern 68 may include a first upper contact layer 66 and a second upper contact layer 67 on the first upper contact layer 66. The first upper contact layer 66 may include, for example, a metal nitride (e.g., TiN or the like). The second upper contact layer 67 may be formed using, for example, a metal material (e.g., tungsten or the like).

The upper contact pattern 68 may include a lower part 68a, an intermediate part 68b on the lower part 68a, and an upper part 68c on the intermediate part 68b. In the upper contact pattern 68, the lower part 68a may be a part electrically connected to the intermediate contact pattern 64, the intermediate part 68b may have a width less than a width of the lower part 68a, and the upper part 68c may be a part disposed at a level higher than the interconnection structure 28.

In the upper contact pattern 68, the lower part 68a may be interposed between the first and second interconnection structures 28_1 and 28_2, the intermediate part 68b may be closer to the second interconnection structure 28_2 than the first interconnection structure 28_1, and the upper part 68c may overlap a part of an upper surface of the second interconnection structure 28_2.

An upper insulating layer 78 may be disposed to be interposed between upper parts 68c of the upper contact patterns 68 of the contact structures 70 and to extend between the interconnection structures 28 and the intermediate parts 68b of the upper contact patterns 68. The upper insulating layer 78 may be formed of, for example, silicon nitride.

Parts of the insulating capping patterns 26 of the interconnection structures 28, which do not overlap the upper parts 68c of the upper contact patterns 68, may be recessed. Upper surfaces of parts of the insulating capping patterns 26 which overlap the upper parts 68c of the upper contact patterns 68 may be located at a level higher than upper surfaces of the parts of the insulating capping patterns 26 which do not overlap the upper parts 68c.

A lower air spacer 72 and an upper air spacer 74 may be interposed between the interconnection structures 28. The lower air spacer 72 may be disposed in a shape of a plurality of lines which are spaced apart from each other in parallel. The lower air spacer 72 may be disposed on lower side surfaces of the interconnection structures 28. The lower air spacer 72 may be disposed on side surfaces of the conductive structures 25 of the interconnection structures 28. The lower air spacer 72 may be interposed between the interconnection structures 28 and the contact structure 70 and may extend between the interconnection structures 28 and the insulating patterns 42.

The lower air spacer 72 may include a first lower air spacer 72a and a second lower air spacer 72b which have line shapes spaced apart from each other in parallel. The first lower air spacer 72a may be interposed between the first interconnection structure 28_1 and the contact structure 70 and may extend between the first interconnection structure 28_1 and the insulating patterns 42. The first lower air spacer 72a may include a first part 72a_1 interposed between the first interconnection structure 28_1 and the contact structure 70, and a second part 72a_2 interposed between the first interconnection structure 28_1 and the insulating patterns 42. The second lower air spacer 72b may be interposed between the second interconnection structure 28_2 and the contact structure 70 and may extend between the second interconnection structure 28_2 and the insulating patterns 42. The second lower air spacer 72b may include a first part 72b_1 interposed between the second interconnection structure 28_2 and the contact structure 70, and a second part 72b_2 interposed between the second interconnection structure 28_2 and the insulating patterns 42.

The first part 72a_1 of the first lower air spacer 72a may have the same height as the first part 72b_1 of the second lower air spacer 72b. The first parts 72a_1 and 72b_1 of the first and second lower air spacers 72a and 72b may have heights different from the second parts 72a2 and 72b_2 of the first and second lower air spacers 72a and 72b. The first parts 72a_1 and 72b_1 of the first and second lower air spacers 72a and 72b may have heights less than the second parts 72a_2 and 72b_2 of the first and second lower air spacers 72a and 72b.

The upper air spacer 74 may be connected to the first and second lower air spacers 72a and 72b. The upper air spacer 74 may be formed in a ring shape. The upper air spacer 74 may be disposed on side surfaces of the upper contact pattern 68. The upper air spacer 74 may be disposed so as to surround side surfaces of the lower part 68a of the upper contact pattern 68.

The upper air spacer 74 may include a first part 74a, a second part 74b, a third part 74c, and a fourth part 74d.

The first part 74a of the upper air spacer 74 may be disposed on the first part 72a_1 of the first lower air spacer 72a and between the first interconnection structure 28_1 and the contact structure 70. The first part 74a of the upper air spacer 74 may be interposed between the insulating capping pattern 26 of the first interconnection structure 28_1 and the lower part 68a of the upper contact pattern 68.

The second part 74b of the upper air spacer 74 may be disposed on the first part 72b_1 of the second lower air spacer 72b and between the second interconnection structure 28_2 and the contact structure 70. The second part 74b of the upper air spacer 74 may be interposed between the insulating capping pattern 26 of the second interconnection structure 28_2 and the lower part 68a of the upper contact pattern 68, and may extend between the insulating capping pattern 26 of the second interconnection structure 28_2 and the intermediate part 68b of the upper contact pattern 68.

The third part 74c of the upper air spacer 74 may be interposed between the contact structure 70 and the first insulating pattern 42_1. The fourth part 74d of the upper air spacer 74 may be interposed between the contact structure 70 and the second insulating pattern 42_2.

In the upper air spacer 74, the first part 74a may have a height less than the second part 74b, the third part 74c, and/or the fourth part 74d. In the upper air spacer 74, an upper end of the first part 74a may be disposed at a level lower than upper ends of the second part 74b, the third part 74c, and/or the fourth part 74d.

The upper air spacer 74 may have a width different from widths of the first and second lower air spacers 72a and 72b. The upper air spacer 74 may have a width less than the widths of the first and second lower air spacers 72a and 72b.

A first spacer layer 30 may be disposed on side surfaces of the interconnection structures 28. A second spacer layer 34 may be disposed to be interposed between the interconnection structures 28 and the lower contact pattern 50 of the contact structure 70 and to extend between the interconnection structures 28 and the insulating patterns 42. A third spacer layer 44 may be disposed to be interposed between the second spacer layer 34 and the lower contact pattern 50 and between the insulating patterns 42 and the lower contact pattern 50. The first, second, and third spacer layers 30, 34, and 44 may be formed using an insulating material (e.g., silicon nitride) which has a dielectric constant greater than air and includes nitrogen.

An upper spacer layer 60 may be interposed between the upper contact pattern 68 and the insulating capping pattern 26. The upper spacer layer 60 may include a part interposed between the upper air spacer 74 and the upper contact pattern 68. The upper spacer layer 60 may be formed of, for example, silicon nitride.

The semiconductor device according to example embodiments of the inventive concepts may include the lower air spacers 72 of line shapes, and the upper air spacer 74 of a ring shape, which is disposed on the lower air spacers 72 and connected to the lower air spacers 72.

Since the conductive structures 25 of the interconnection structures 28 may be bit lines of a memory device and the upper/lower air spacers 72 and 74 may reduce bit line loading capacitance in the memory device such as a DRAM, or the like, a bit line sensing margin may be improved. Accordingly, performance of the semiconductor device may be improved.

In example embodiments of the inventive concepts, the lower air spacers 72 and the upper air spacer 74 may be formed to have different thicknesses. For example, a thickness (or a width) of each of the lower air spacers 72 may be maximized, and thus a bit line sensing margin may be minimized. Furthermore, the upper air spacer 74 may be formed to have a thickness (or a width) less than the lower air spacers 72, a width of the lower part 68a of the upper contact pattern 68 surrounded by the upper air spacer 74 may be increased, and thus resistance characteristics of the contact structure 70 may be improved.

In example embodiments of the inventive concepts, upper ends of the second parts 72a_2 and 72b_2 of the lower air spacer 72 may be sealed or covered with the upper insulating layer 78, and the second parts 72a_2 and 72b_2 of the lower air spacer 72 may not overlap the insulating patterns 42 in a direction perpendicular to the semiconductor substrate 2. However, the scope of the inventive concepts is not limited thereto. For example, the upper ends of the second parts 72a_2 and 72b_2 of the lower air spacer 72 may overlap the insulating patterns 42 in the direction perpendicular to the semiconductor substrate 2. The insulating patterns 42 that may overlap the upper ends of the second parts 72a_2 and 72b_2 of the lower air spacer 72 will be described with reference to FIG. 4.

Figure 4:
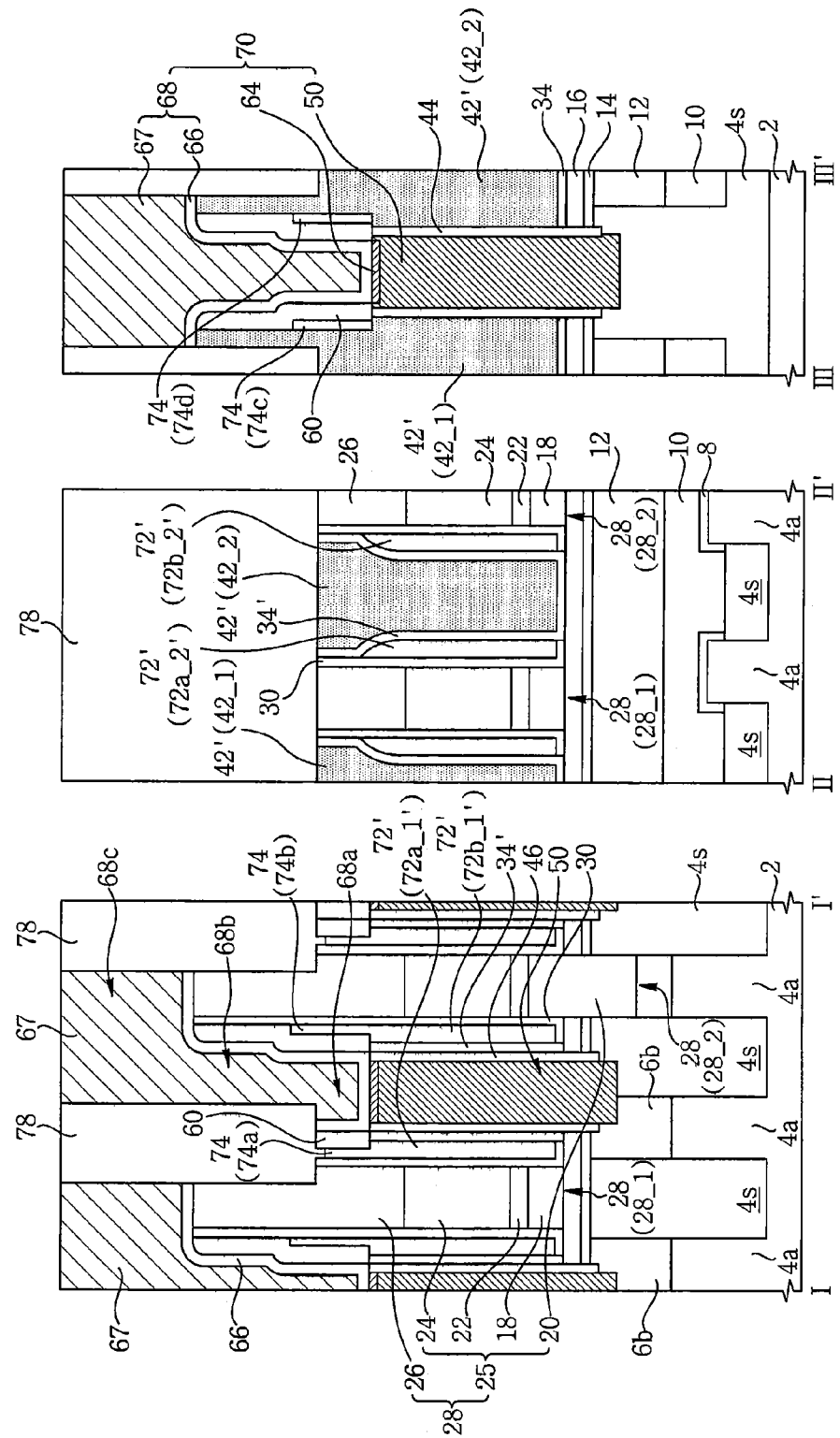
FIG. 4 is a cross-sectional view of a semiconductor device according to example embodiments of the inventive concepts.

Referring to FIG. 4, the insulating patterns 42 (shown in FIG. 3) may be modified into insulating patterns 42', each of which has a lower area and an upper area that is disposed on the lower area and has a width greater than a width of the lower area. The upper areas of the insulating patterns 42' may be closer to the interconnection structures 28 than the lower areas of the insulating patterns 42'.

A lower air spacer 72' corresponding to the lower air spacer 72 described in FIGS. 2 and 3 may be disposed. The lower air spacer 72' may include first parts 72a_1' and 72b_1' corresponding to the first parts 72a_1 and 72b_1 of the lower air spacer 72 described in FIGS. 2 and 3. The first parts 72a_1' and 72b_1' of the lower air spacer 72' may be interposed between the interconnection structures 28 and the contact structure 70. The lower air spacer 72' may include second parts 72a_2' and 72b_2' interposed between the interconnection structures 28 and the lower area of the insulating patterns 42'. Upper ends of the second parts 72a_2' and 72b_2' of the lower air spacer 72' may overlap the upper areas of the insulating patterns 42' in a direction perpendicular to the semiconductor substrate 2.

The upper ends of the first parts 72a_1' and 72b_1' of the lower air spacer 72' may be sealed with the upper insulating layer 78, and the upper ends of the second parts 72a_2' and 72b_2' of the lower air spacer 72' may be sealed with the third insulating layer 34' and/or may be covered with the insulating patterns 42'.

In example embodiments of the inventive concepts, the upper air spacer 74 may have a width less than a width of the lower air spacer 72. However, the scope of the inventive concepts is not limited thereto. For example, the upper air spacer 74 may have a width substantially equal to or greater than a width of the lower air spacer 72. An upper air spacer having a width substantially equal to or greater than a width of a lower air spacer will be described with reference to FIG. 5.

Figure 5:
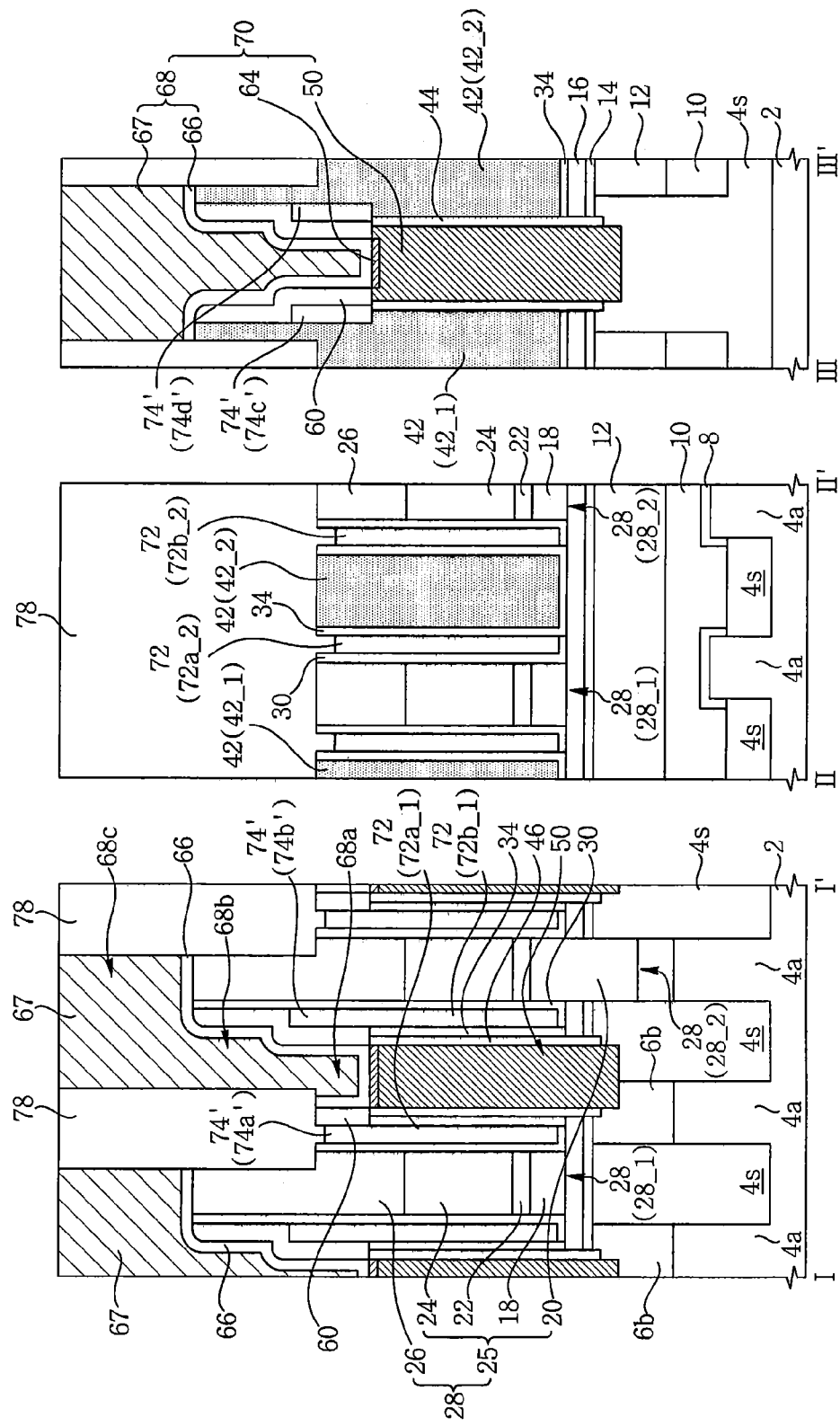
FIG. 5 is a cross-sectional view of a semiconductor device according to example embodiments of the inventive concepts.

Referring to FIG. 5, an upper air spacer 74' having a width substantially equal to or greater than a width of a lower air spacer 72 may be disposed. The upper air spacer 74' may surround parts of side surfaces of the contact structure 70 in a ring shape like the upper air spacer 74 described with reference to FIG. 3.

The upper air spacer 74' may include a first part 74a' interposed between the insulating capping pattern 26 of the first interconnection structure 28_1 and the lower part 68a of the upper contact pattern 68, a second part 74b' which is interposed between the insulating capping pattern 26 of the second interconnection structure 28_2 and the lower part 68a of the upper contact pattern 68 and extends between the insulating capping pattern 26 of the second interconnection structure 28_2 and the intermediate part 68b of the upper contact pattern 68, a third part 74c' interposed between the contact structure 70 and the first insulating pattern 42_1, and a fourth part 74d' interposed between the contact structure 70 and the second insulating pattern 42_2. The first through fourth parts 74a', 74b', 74c', and 74d' of the upper air spacer 74' may have widths substantially equal to or greater than a width of the lower air spacer 72.

In example embodiments of the inventive concepts, second parts 72a_2 and 72b_2 of the lower air spacer 72 may not overlap the insulating patterns 42 in a direction perpendicular to the semiconductor substrate 2, and the upper air spacer 74 may have a width less than a width of the lower air spacer 72. However, the scope of the inventive concepts is not limited thereto. For example, the second parts of the lower air spacer may overlap the insulating patterns in a direction perpendicular to the semiconductor substrate, and the upper air spacer may have a width substantially equal to or greater than the lower air spacer. The lower air spacer, the insulating patterns, and the upper air spacer, which may be modified as described above, will be described with reference to FIG. 6.

Figure 6:
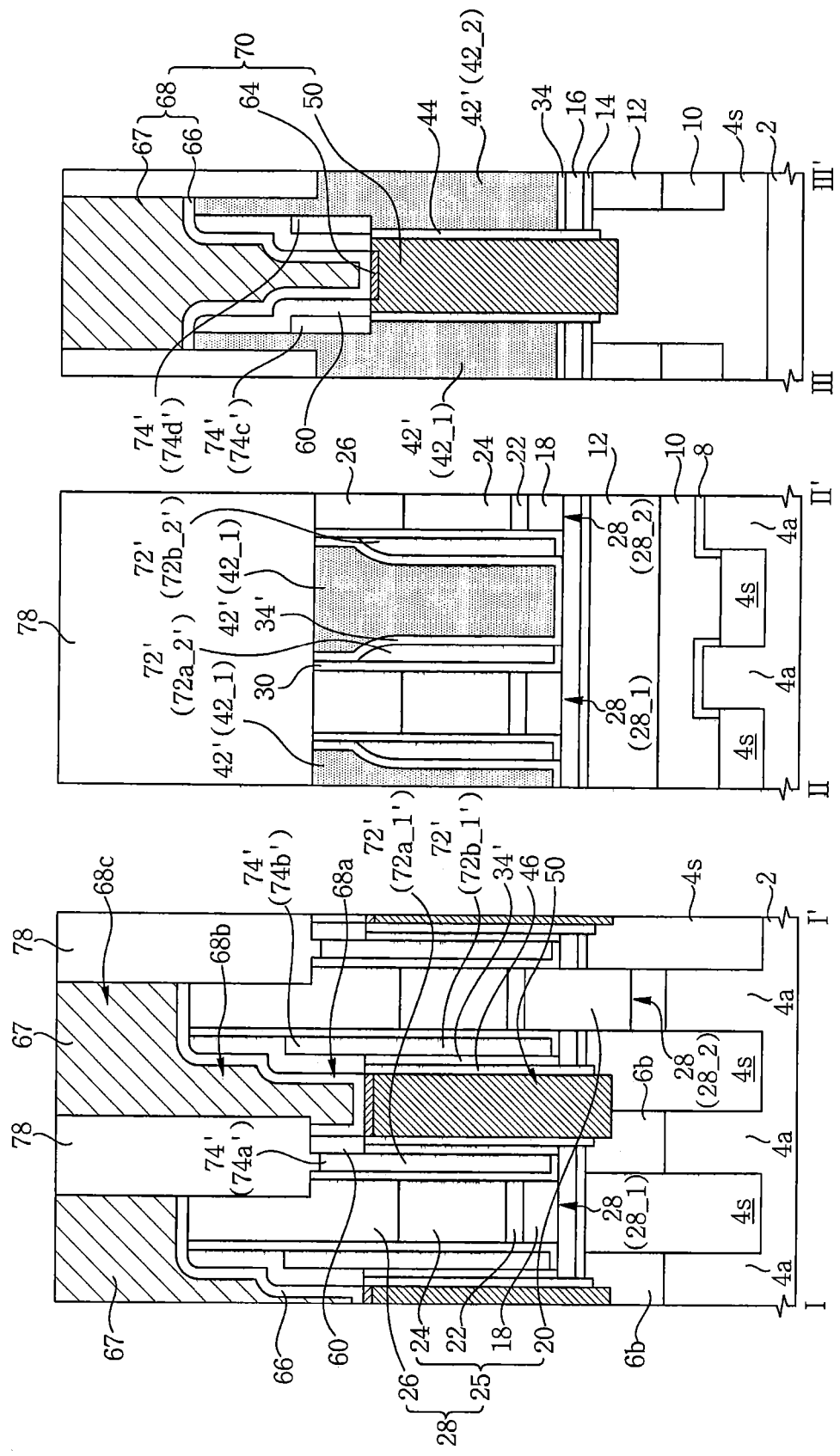
FIG. 6 is a cross-sectional view of a semiconductor device according to example embodiments of the inventive concepts.

Referring to FIG. 6, insulating patterns 42', each of which has a lower area and an upper area that is disposed on the lower area and has a width greater than a width of the lower area, as described in FIG. 4, may be disposed. As described in FIG. 4, a lower air spacer 72' including second parts 72a_2' and 72b_2' which overlap an upper area of the insulating patterns 42' in a direction perpendicular to the semiconductor substrate 2 may be disposed.

An upper air spacer 74' having a width substantially equal to or greater than a width of the lower air spacer 72' may be disposed. The upper air spacer 74' may surround parts of side surfaces of the contact structure 70 in a ring shape like the upper air spacer 74 described with reference to FIG. 3.

As described in FIG. 5, the upper air spacer 74' may include a first part 74a' interposed between the insulating capping pattern 26 of the first interconnection structure 28_1 and the lower part 68a of the upper contact pattern 68, a second part 74b', which is interposed between the insulating capping pattern 26 of the second interconnection structure 28_2 and the lower part 68a of the upper contact pattern 68 and extends between the insulating capping pattern 26 of the second interconnection structure 28_2 and the intermediate part 68b of the upper contact pattern 68, a third part 74c' interposed between the contact structure 70 and the first insulating pattern 42_1, and a fourth part 74d' interposed between the contact structure 70 and the second insulating pattern 42_2. The first to fourth parts 74a', 74b', 74c', and 74d' of the upper air spacer 74' may be formed to have widths substantially equal to or greater than a width of the lower air spacer 72'.

An example of a method of forming a semiconductor device according to example embodiments of the inventive concepts will be described with reference to FIGS. 1, 2, 3, and 7 through 13, 14a, 14b and 15 through 17.

Figure 7:
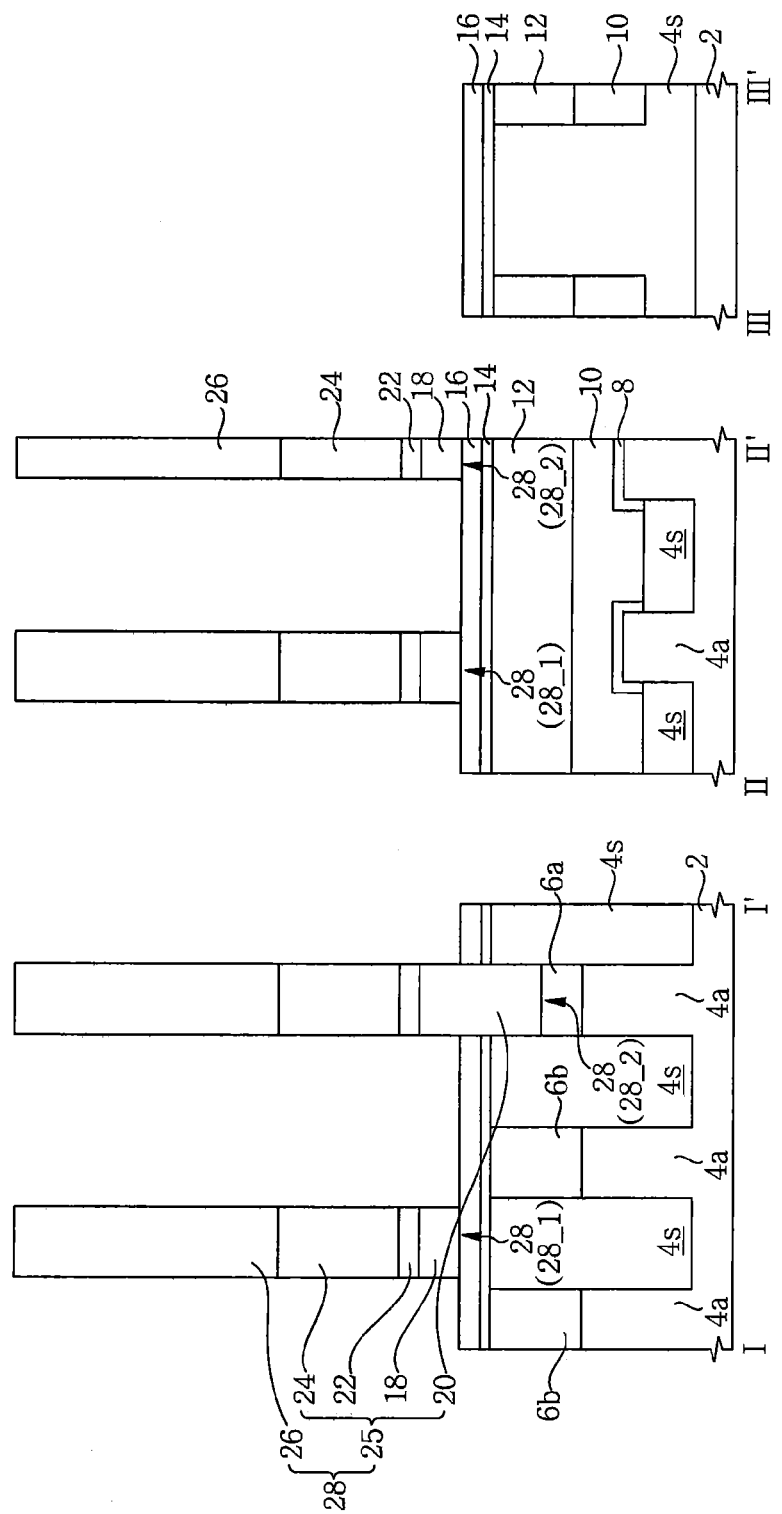
FIGS. 7 through 13, 14a, 14b and 15 through 17 are cross-sectional views illustrating a method of forming a semiconductor device according to example embodiments of the inventive concepts.

Referring to FIGS. 1, 2, and 7, a semiconductor substrate 2 may be prepared. The semiconductor substrate 2 may be formed using a semiconductor material such as single crystalline silicon, etc. An isolation region 4s which defines an active region 4a may be disposed on the semiconductor substrate 2. The isolation region 4s may be a shallow trench isolation layer.

Cell transistors may be formed in the semiconductor substrate 2. Each of the cell transistors may include a gate dielectric film 8, a gate electrode 10, a first source/drain region 6a, and a second source/drain region 6b. A formation of the gate dielectric film 8 and the gate electrode 10 may include forming a gate trench, which crosses the active region 4a and extends into the isolation region 4s, forming the gate dielectric film 8 on a part of the active region 4a exposed by the gate trench, and forming the gate electrode 10 which fills a part of the gate trench on the gate dielectric 8. An insulating gate capping pattern 12 may be formed on the gate electrode 10 to fill the remaining parts of the gate trench. A formation of the first source/drain region 6a and the second source/drain region 6b may include implanting impurity ions into the active region 4a using an ion implantation process.

The gate electrode 10 may be a word line of a memory device such as a DRAM, etc. The gate electrode 10 may be formed at a level lower than an upper surface of the active region 4a.

A first interlayer insulating layer 14 and a second interlayer insulating layer 16 may be sequentially formed on the substrate 2 including the cell transistors and the insulating gate capping pattern 12. The second interlayer insulating layer 16 may be formed using a material having an etch selectivity with respect to the first interlayer insulating layer 14. For example, the first interlayer insulating layer 14 may be formed of silicon oxide, and the second interlayer insulating layer 16 may be formed of silicon nitride.

Interconnection structures 28 may be formed on the second interlayer insulating layer 16. In the memory device such as a DRAM, or the like, the interconnection structures 28 may be bit line structures. The interconnection structures 28 may include a first interconnection structure 28_1 and a second interconnection structure 28_2 which are adjacent and parallel to each other.

Each of the interconnection structures 28 may include a conductive structure 25 and an insulating capping pattern 26 which are sequentially stacked. The insulating capping pattern 26 may be formed of, for example, silicon nitride. The conductive structure 25 may include an interconnection lower pattern 18, an interconnection contact pattern 20, an interconnection intermediate pattern 22, and an interconnection upper pattern 24. The interconnection contact pattern 20 may pass through the interconnection lower pattern 18 and may be electrically connected to the first source/drain region 6a on a part which overlaps the active region 4a. The interconnection contact pattern 20 and the interconnection lower pattern 18 may be formed of, for example, polysilicon. The interconnection intermediate pattern 22 may be formed of, for example, a metal silicide (e.g., tungsten silicide, or the like) and/or a metal nitride (e.g., TiN, WN, or the like) on the interconnection contact pattern 20 and the interconnection lower pattern 18. The interconnection upper pattern 24 may be formed using, for example, a metal material (e.g., tungsten, or the like) on the interconnection intermediate pattern 22.

Figure 8:
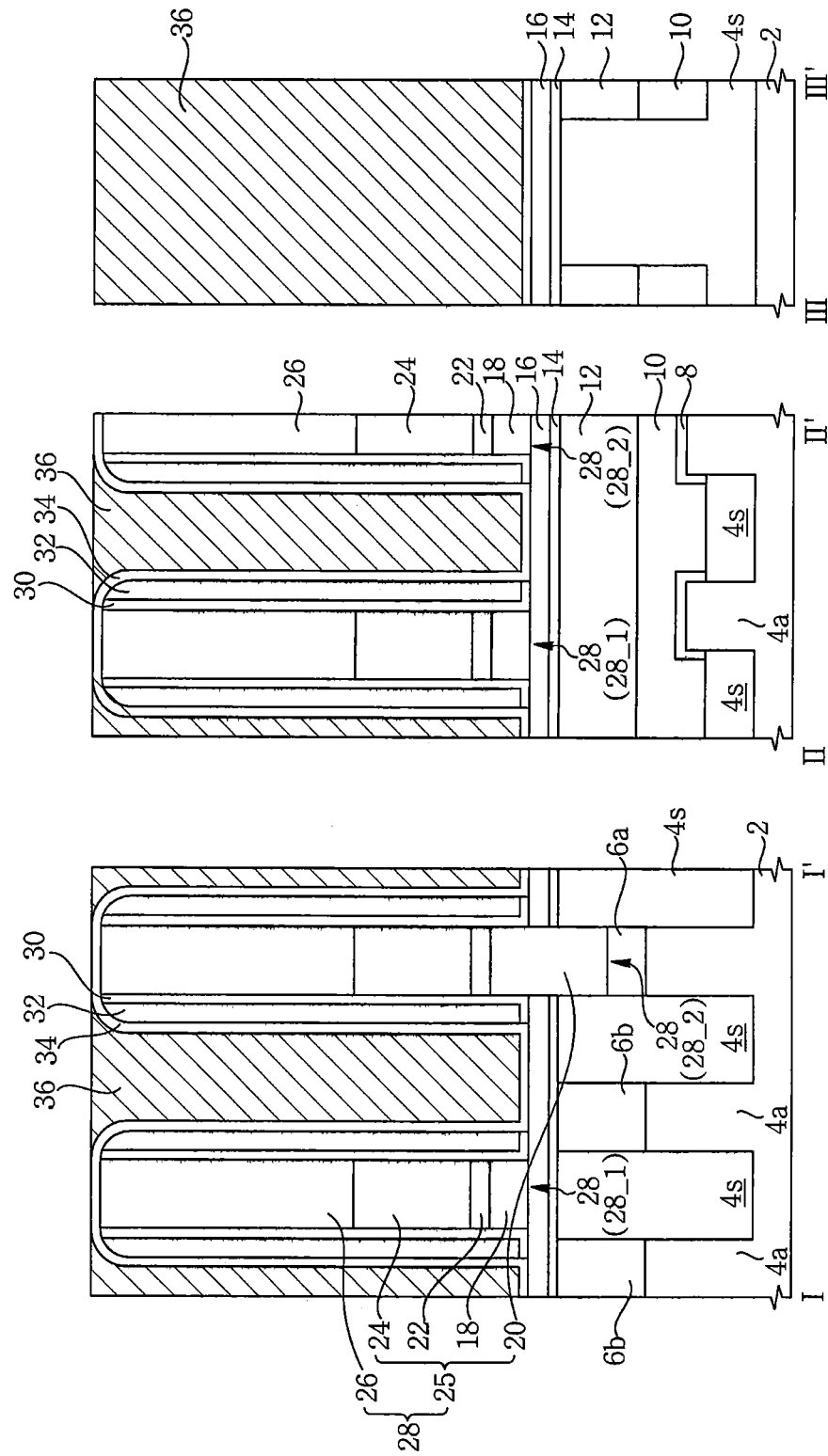

Referring to FIGS. 1, 2, and 8, a first spacer layer 30 may be conformally formed on the substrate 2 including the interconnection structures 28. A sacrificial spacer layer 32 may be conformally formed on the first spacer layer 30. Then, the first spacer layer 30 and the sacrificial spacer layer 32 may be etched using an anisotropic etching process. Therefore, the first spacer layer 30 and the sacrificial spacer layer 32 may be formed on side surfaces of the interconnection structures 28.

In example embodiments, an upper end of the sacrificial spacer layer 32 may be formed at substantially the same level as an upper surface of the insulating capping pattern 26.

In example embodiments, the sacrificial spacer layer 32 may be over-etched, and thus the upper end of the sacrificial spacer layer 32 may be formed at a level lower than the upper surface of the insulating capping pattern 26. As described above, the sacrificial spacer layer 32 formed by the over-etching may be used in the processes of forming the lower air spacers 72' of FIGS. 4 and 6.

A second spacer layer 34 may be conformally formed on the substrate 2 including the first spacer layer 30 and the sacrificial spacer layer 32. The first and second spacer layers 30 and 34 may be formed using a material having an etch selectivity with respect to the sacrificial spacer layer 32. For example, the first and second spacer layers 30 and 34 may be formed of silicon nitride, and the sacrificial spacer layer 32 may be formed of silicon oxide.

A molding layer 36 may be formed on the second spacer layer 34 to fill between the interconnection structures 28. The formation of the molding layer 36 may include forming a material layer on the second spacer layer 34 and planarizing the material layer. The planarizing of the material layer may be performed using an etch-back technique. The molding layer 36 may be formed using a material (e.g., silicon oxide) having an etch selectivity with respect to the second spacer layer 34.

Figure 9:
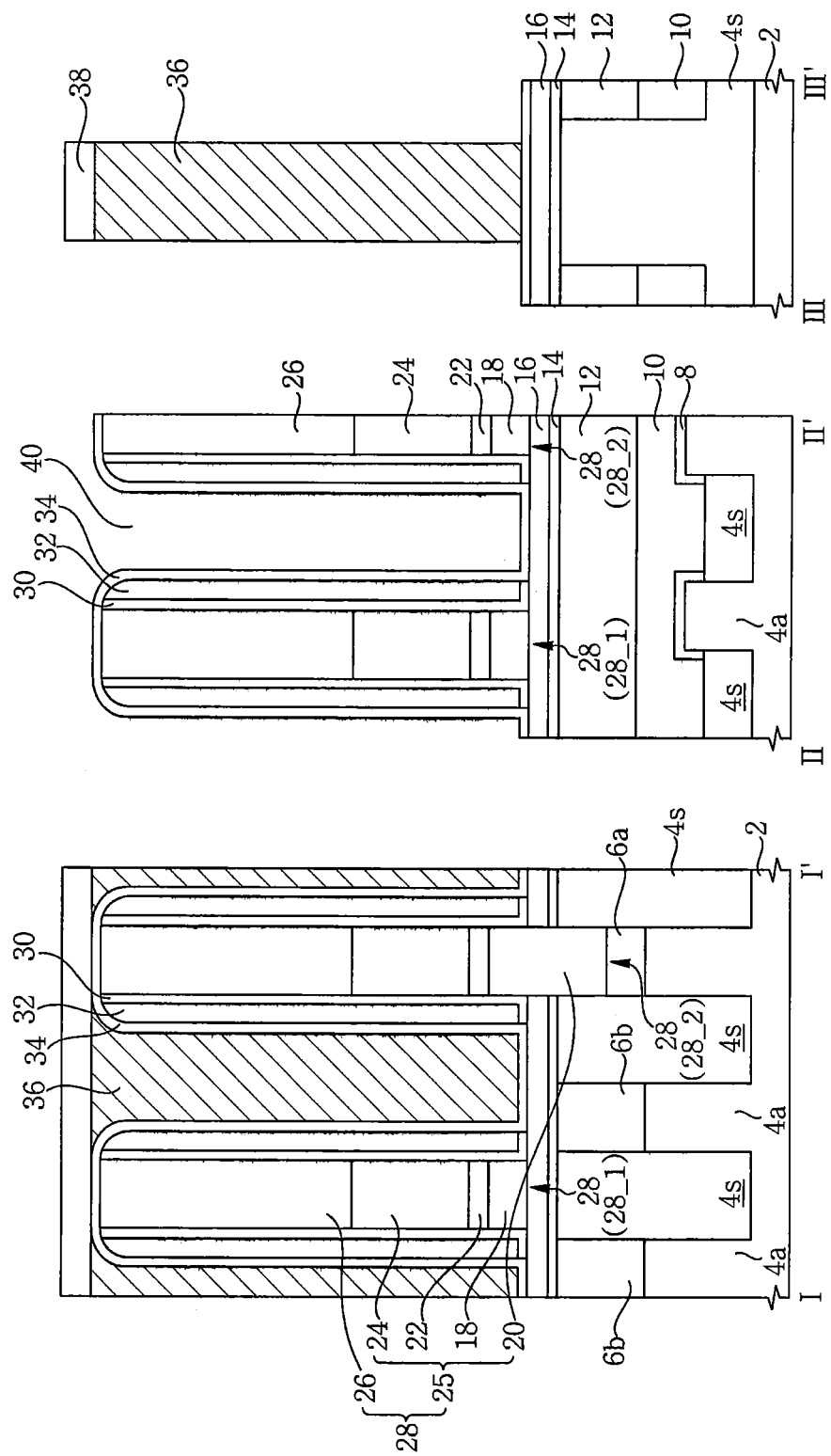

Referring to FIGS. 1, 2, and 9, isolation holes 40 may be formed between the interconnection structures 28 by patterning the molding layer 36. The patterning of the molding layer 36 may include forming a mask pattern 38 on the substrate 2 including the molding layer 36 and etching the molding layer 36. The mask pattern 38 may include, for example, silicon oxide. The mask pattern 38 may be formed in a line shape extending in a direction which crosses the interconnection structures 28.

Figure 10:
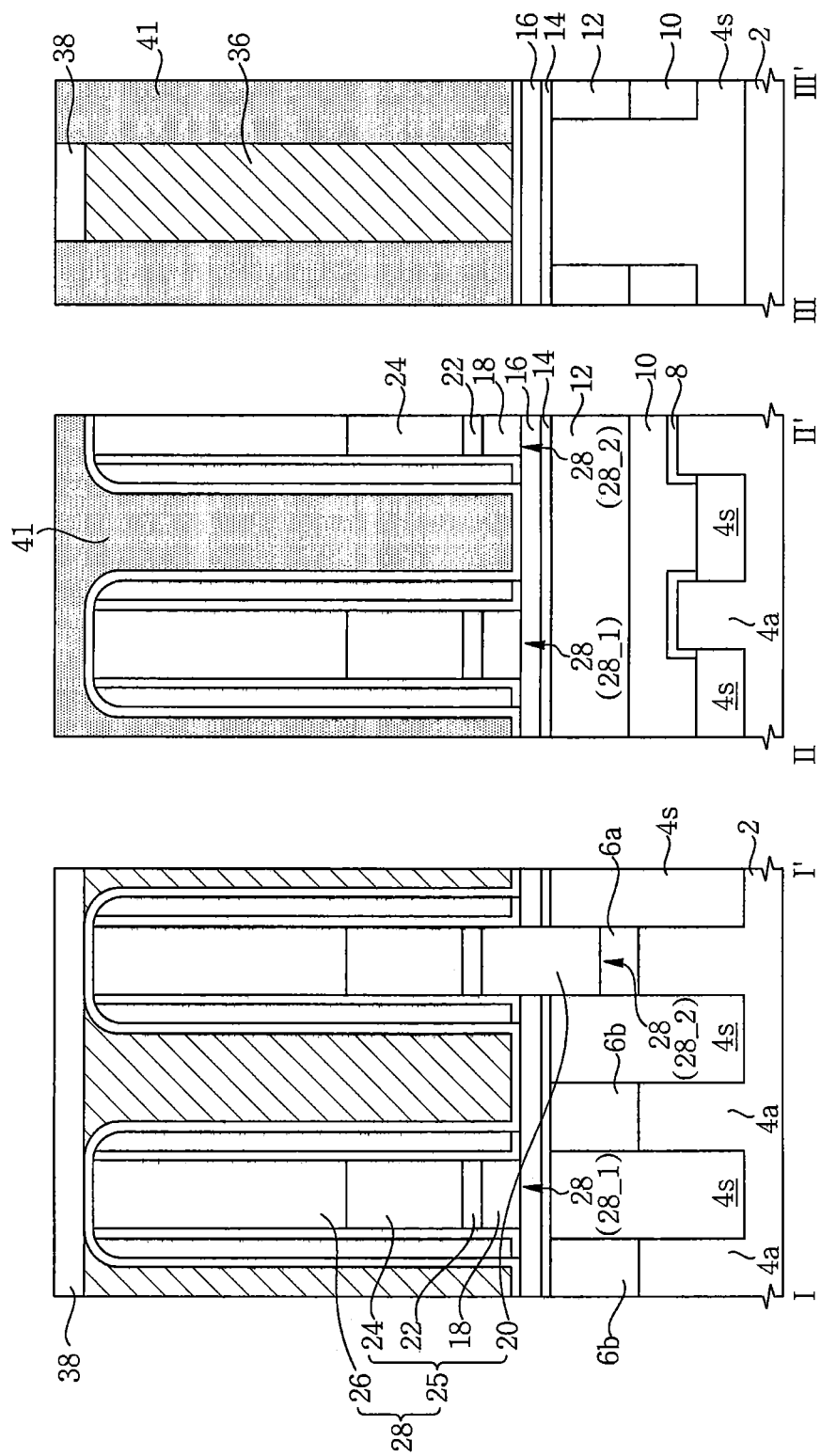

Referring to FIGS. 1, 2, and 10, an insulating material layer may be formed on the substrate 2 on which the isolation holes 40 are formed and an insulating isolation layer 41 may be formed by planarizing the insulating material layer. An upper surface of the mask pattern 38 may be exposed.

The insulating isolation layer 41 may have an upper surface located at a level higher than upper surfaces of the interconnection structures 28. However, the scope of the inventive concepts is not limited thereto. For example, the insulating isolation layers 41 may be formed to be separated from each other and to be buried in the isolation holes 40.

Figure 11:
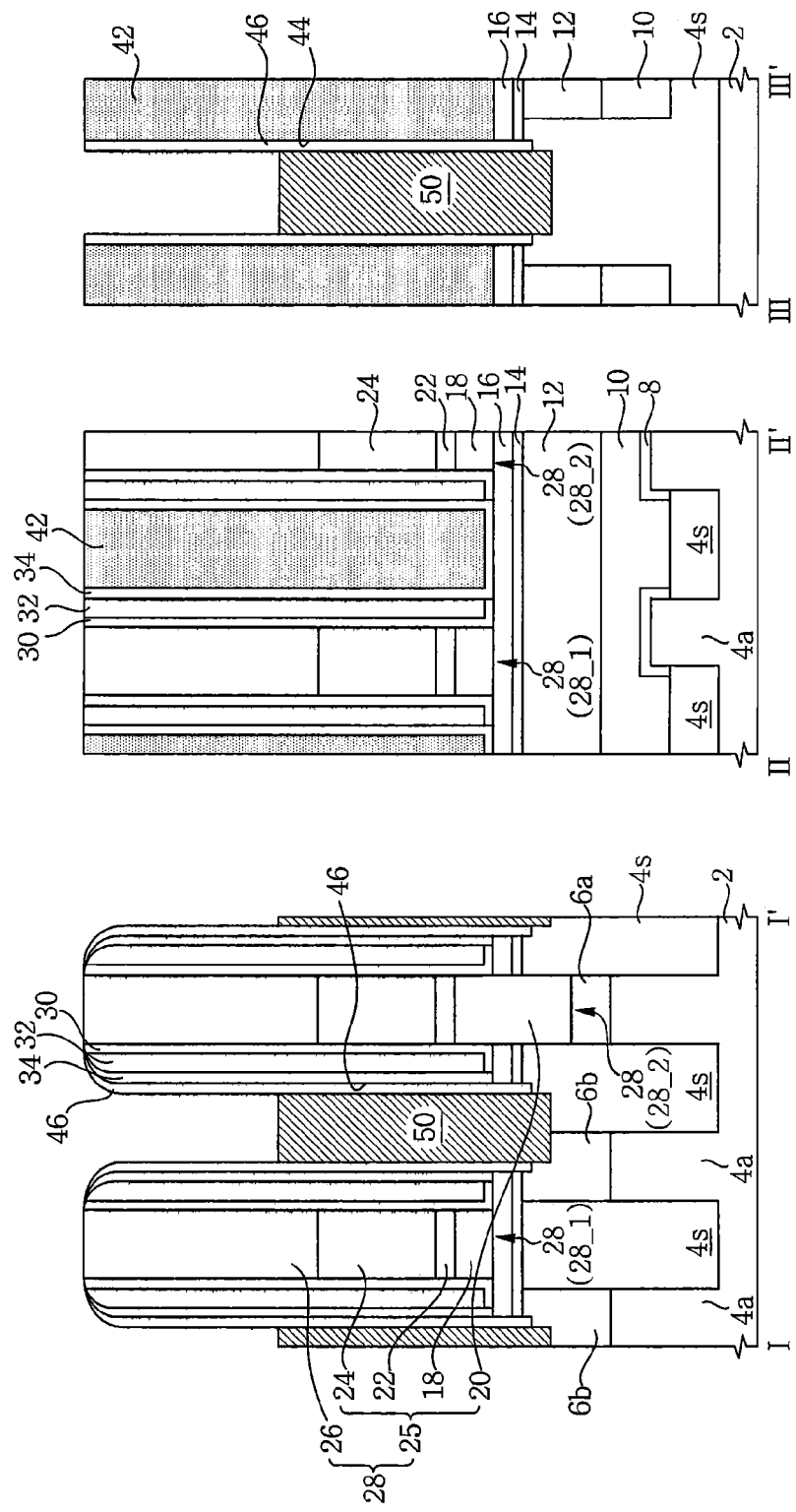

Referring to FIGS. 1, 2, and 11, the mask pattern 38 (shown in FIG. 10) and the molding layer 36 (shown in FIG. 10) may be etched and removed using the insulating isolation layer 41 as an etch mask. Then, a contact hole 46 may be formed by sequentially etching the second spacer layer 34, the second interlayer insulating layer 16, and the first interlayer insulating layer 14 until the second source/drain region 6b in the active region 4a under the molding layer 36 (shown in FIG. 10) is exposed. By partially etching a part of the insulating isolation layer 41 during the etching process for forming the contact hole 46, insulating patterns 42 may be formed to be disposed between the interconnection structures 28.

In example embodiments, a part of the second spacer layer 34 located on the interconnection structures 28 may be etched.

A third spacer layer 44 may be formed on side walls of the contact hole 46. The third spacer layer 44 may be formed of, for example, silicon nitride. The third spacer layer 44 may be formed in a ring shape, when viewed from a plan view.

A bottom of the contact hole 46 may overlap the second source/drain region 6b and the isolation region 4s. The bottom of the contact hole 46 may be formed to be recessed in a downward direction from an upper surface of the active region 4a.

A lower contact pattern 50 may be formed to partially fill the contact hole 46. The lower contact pattern 50 may be formed between the interconnection structures 28 and between the insulating patterns 42. The lower contact pattern 50 may be electrically connected to the second source/drain region 6b. The lower contact pattern 50 may include, for example, silicon. The lower contact pattern 50 may be formed of, for example, doped polysilicon. The formation of the lower contact pattern 50 may include forming polysilicon on the substrate 2 including the contact hole 46 and partially etching the polysilicon.

In example embodiments, an upper surface of the lower contact pattern 50 may be formed at a level higher than an upper surface of the conductive structure 25 of the interconnection structures 28.

Figure 12:
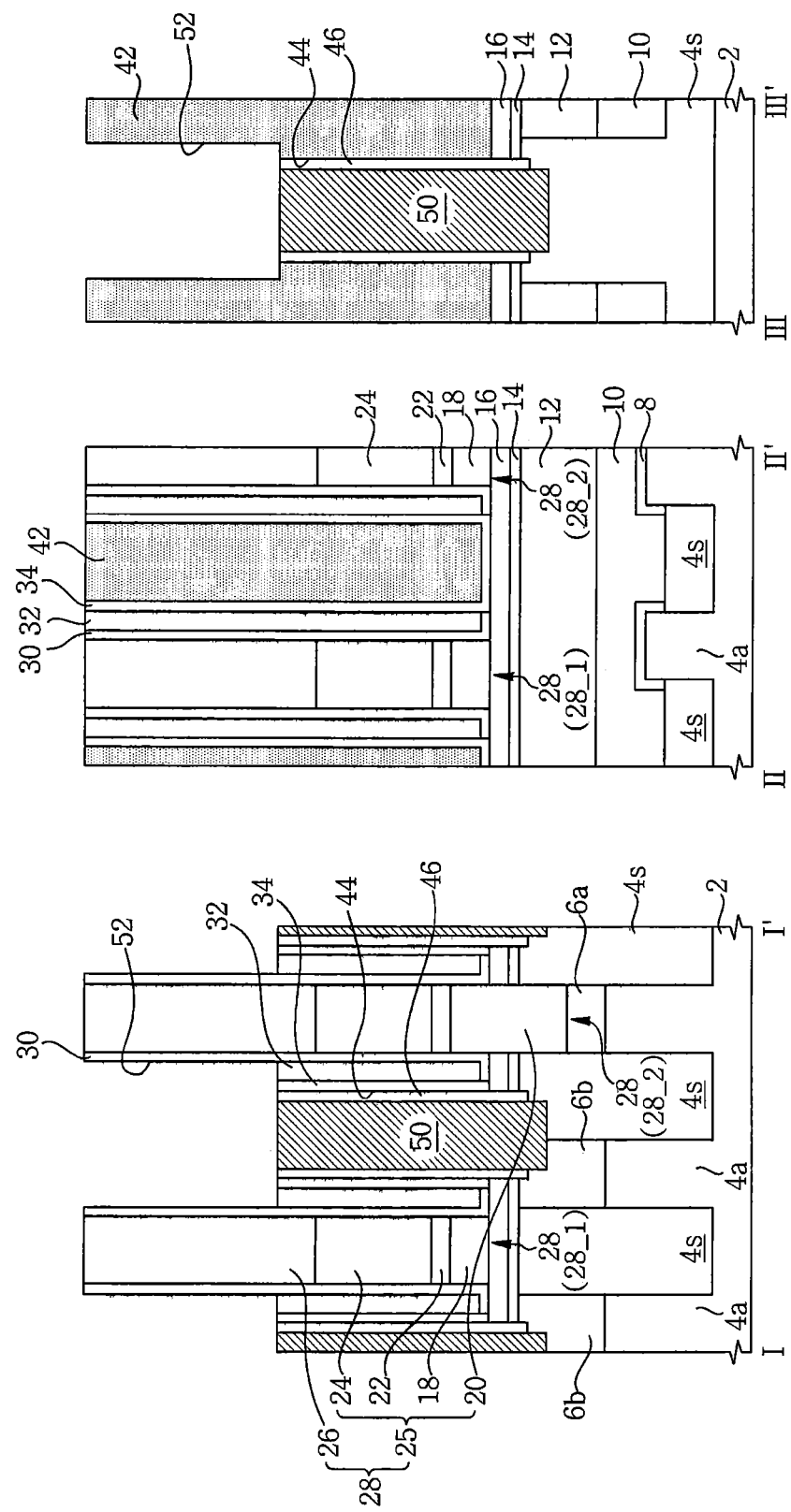

Referring to FIGS. 1, 2, and 12, the third spacer layer 44, the second spacer layer 34, and the sacrificial spacer layer 32, which are located at a level higher than the lower contact pattern 50, may be removed by etching. The etching process may be performed using an isotropic etching process. Accordingly, a distance between the insulating patterns 42 located at a level higher than the lower contact pattern 50 may be increased. Therefore, an upper hole 52 having a width greater than a width of the contact hole 46 may be formed on the lower contact pattern 50.

Figure 13:
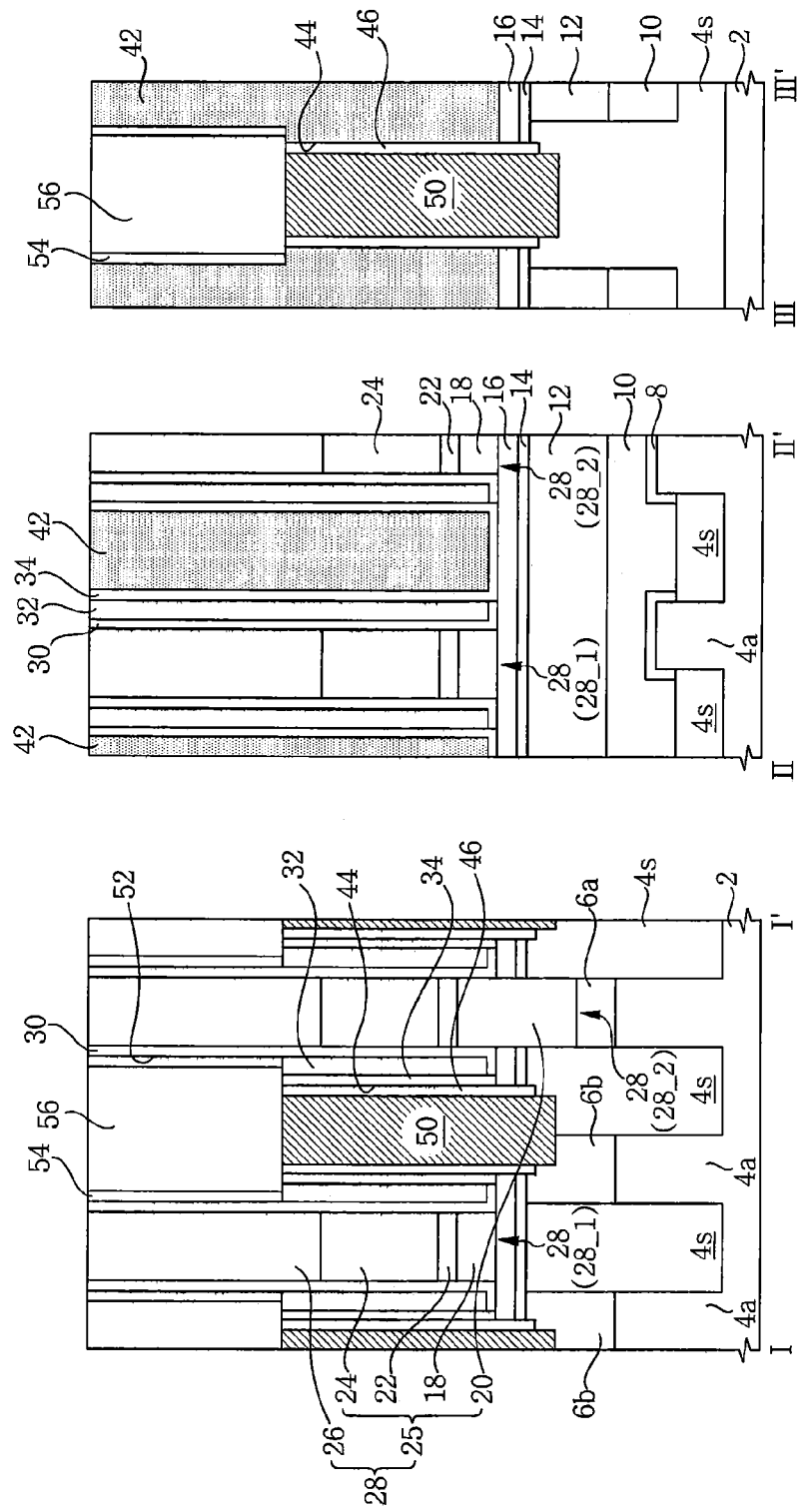

Referring to FIGS. 1, 2, and 13, an upper sacrificial layer 54 may be formed on side walls of the upper hole 52. The upper sacrificial layer 54 may be formed using the same material (e.g., of silicon oxide) as the sacrificial spacer layer 32.

In example embodiments, the upper sacrificial layer 54 may be formed to have a thickness less than a thickness of the sacrificial spacer layer 32.

In example embodiments, the upper sacrificial layer 54 may be formed to have a thickness substantially equal to or greater than a thickness of the sacrificial spacer layer 32.

The material layer 56 which fills the upper hole 52 may be formed on the substrate 2 including the upper sacrificial layer 54. The material layer 56 may be formed using a coating process. The material layer 56 may be formed using, for example, a spin on hard mask (SOH) material.

Figure 14A:
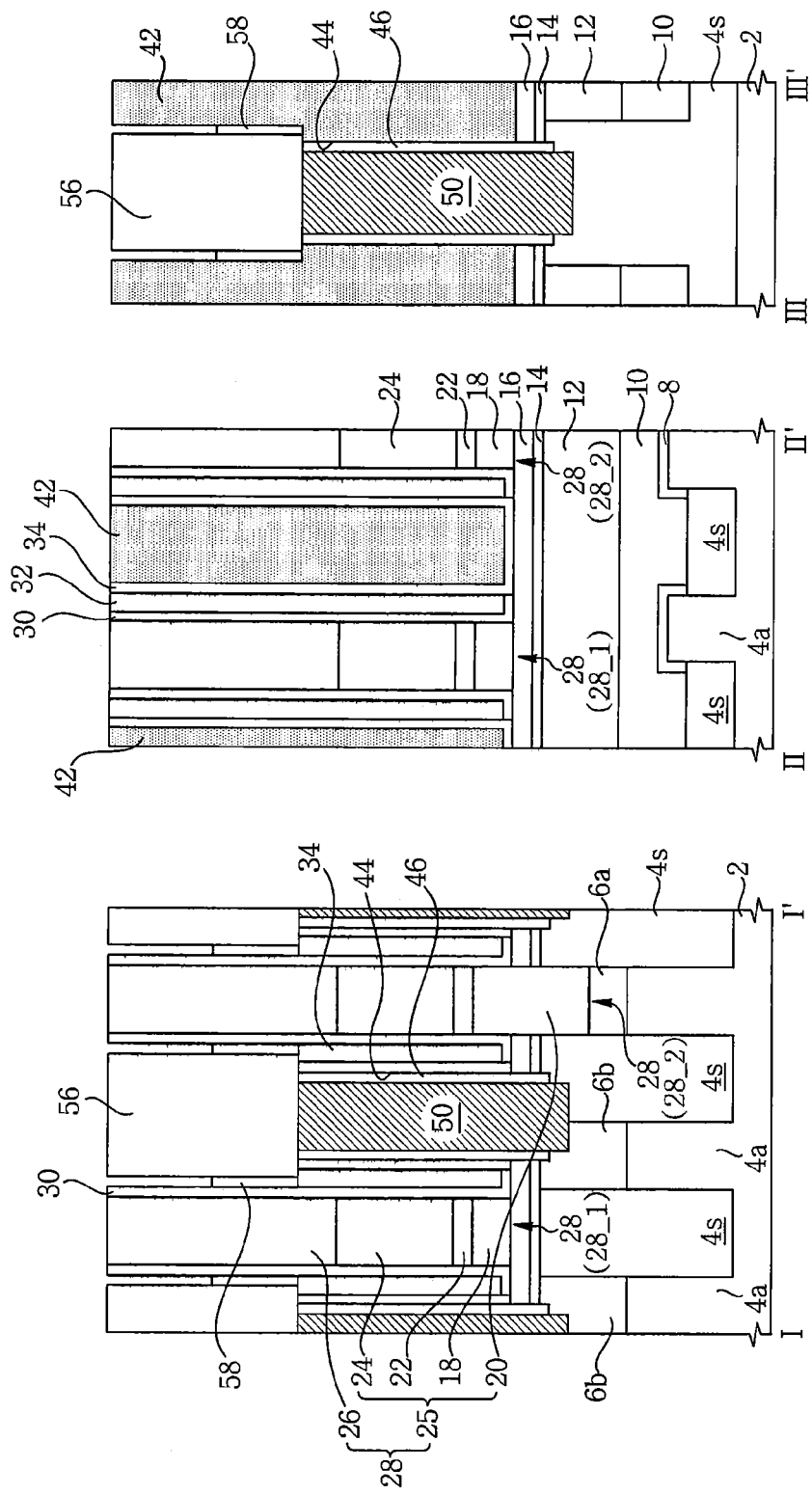

Referring to FIGS. 1, 2, and 14a, an upper sacrificial pattern 58 may be formed by etching the upper sacrificial layer 54 using the material layer 56, the first spacer layer 30, and the insulating capping pattern 26 as etch masks. The upper sacrificial pattern 58 may be formed at a level lower than the upper surface of the insulating capping pattern 26.

The method of etching the upper sacrificial layer 54 is not limited to the method of etching described in FIG. 14a. An example of the method of etching the upper sacrificial layer 54 will be described with reference to FIG. 14b.

Figure 14B:
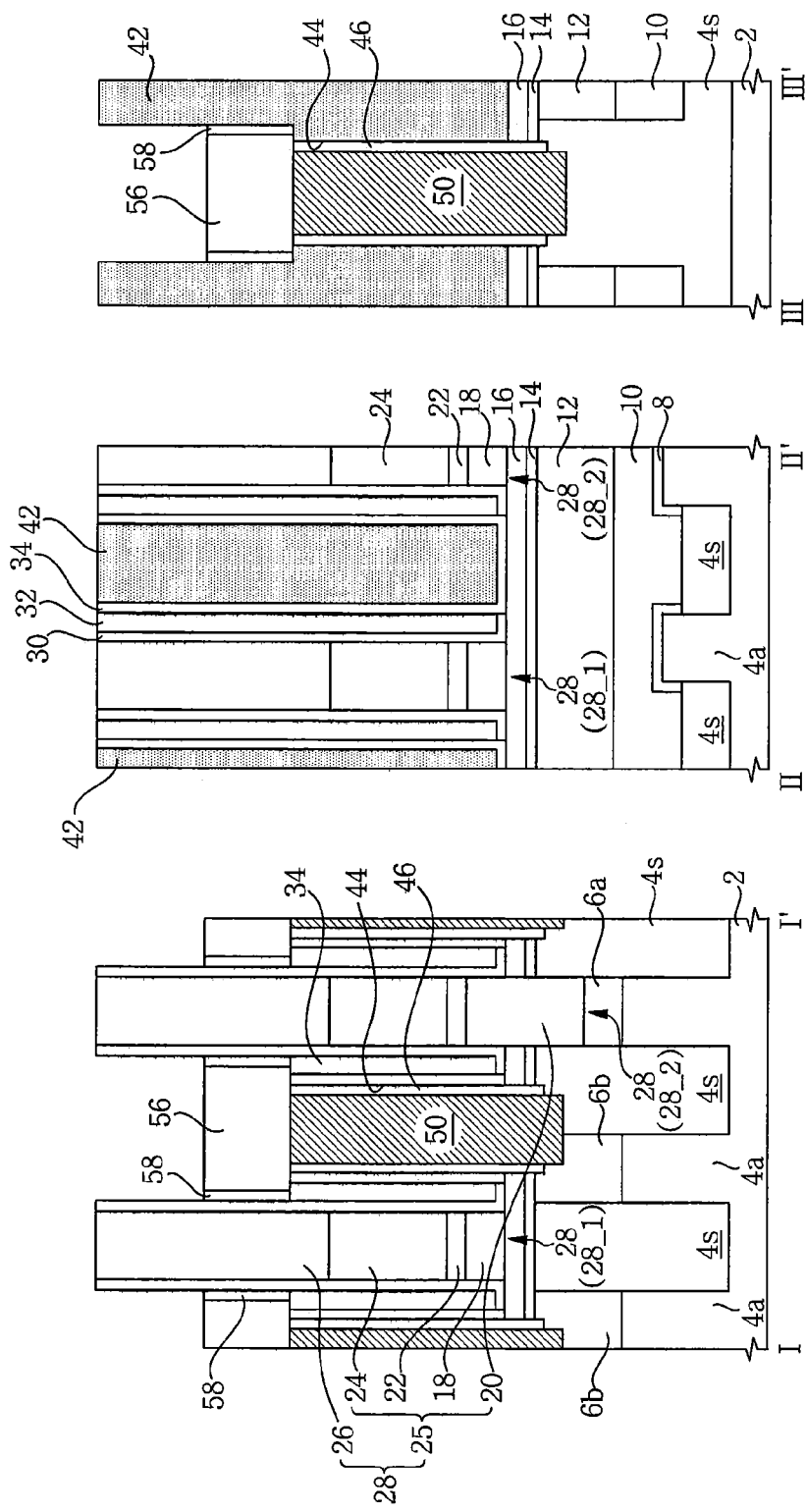

Referring to FIG. 14b, the upper sacrificial pattern 58 may be formed by etching the material layer 56 and the upper sacrificial layer 54 using the first spacer layer 30 and the insulating capping pattern 26 as etch masks.

In example embodiments, the material layer 56 and the upper sacrificial layer 54 may be concurrently etched.

In example embodiments, after partially etching the material layer 56, the upper sacrificial pattern 58 may be formed by etching an exposed part of the upper sacrificial layer 54.

Figure 15:
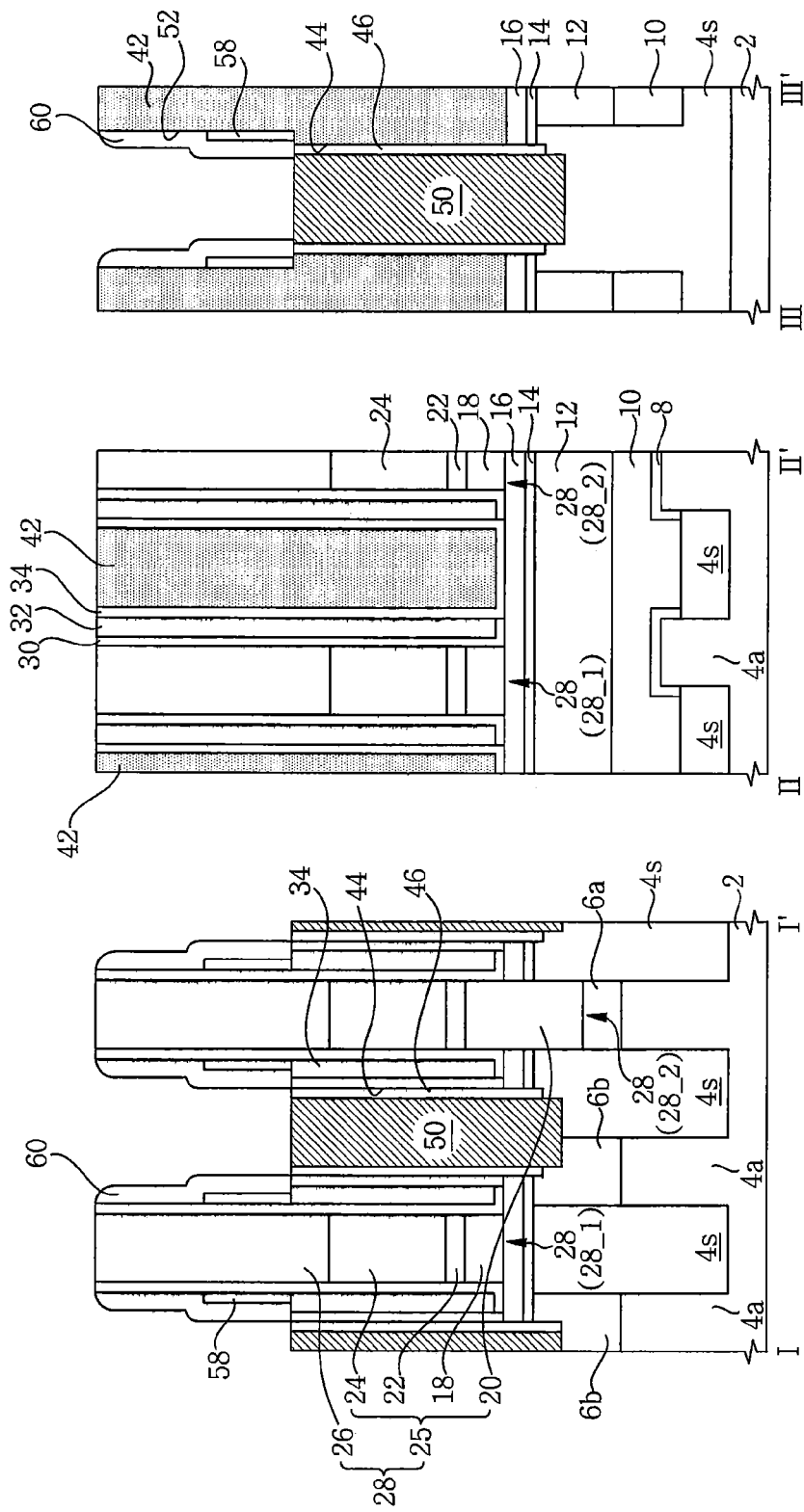

Referring to FIGS. 1, 2, and 15, the material layer 56 (shown in FIG. 14a or 14b) may be removed by selectively etching the material layer 56. Therefore, the upper sacrificial pattern 58 may be exposed.

An upper spacer layer 60 may be formed on the side wall of the upper hole 52 to cover the upper sacrificial pattern 58. The formation of the upper spacer layer 60 may include conformally forming a spacer material layer on the substrate 2 including the upper sacrificial pattern 58 and etching the spacer material layer using an anisotropic etching process. The upper spacer layer 60 may be formed using a material (e.g., silicon nitride) having an etch selectivity with respect to the upper sacrificial pattern 58.

Figure 16:
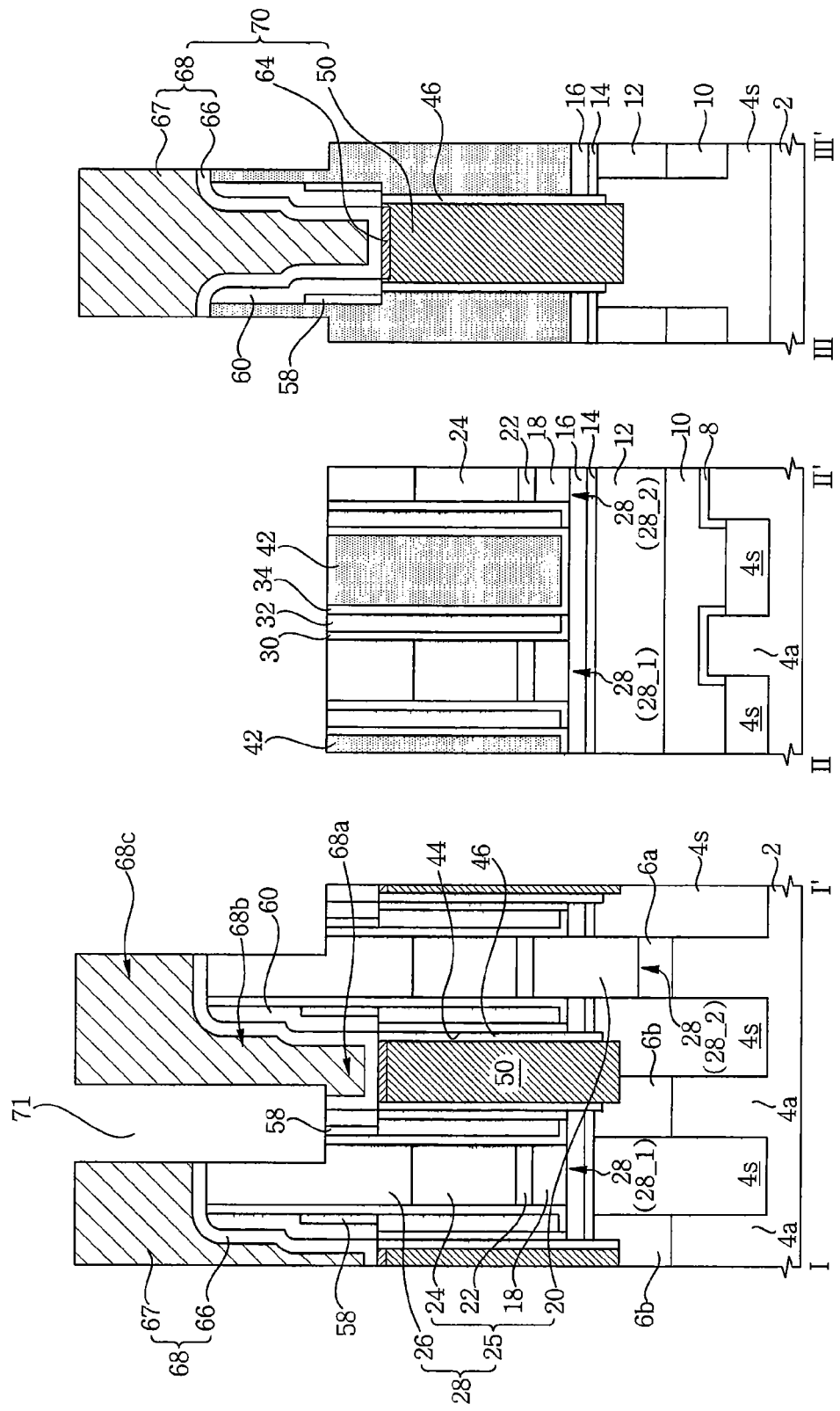

Referring to FIGS. 1, 2, and 16, an intermediate contact pattern 64 may be formed on the lower contact pattern 50 through a silicide process. The intermediate contact pattern 64 may be formed of a metal silicide (e.g., TiSi, WSi, NiSi, CoSi, or the like).

An upper contact layer may be formed on the substrate 2 including the intermediate contact pattern 64, and an upper contact pattern 68 may be formed by patterning the upper contact layer.

The formation of the upper contact pattern 68 may include conformally forming a first upper contact layer 66 on the substrate 2 including the intermediate contact pattern 64, forming a second upper contact layer 67 on the first upper contact layer 66, which fills the upper hole 52 and covers the interconnection structures 28, and patterning the first and second upper contact layers 66 and 67. The first upper contact layer 66 may include, for example, metal nitride (e.g., TiN or the like). The second upper contact layer 67 may be formed using, for example, a metal material (e.g., tungsten or the like).

A recessed part 71 may be formed by etching parts which do not overlap the upper contact pattern 68 during patterning the first and second upper contact layers 66 and 67. The recessed part 71 may be formed by etching the insulating capping pattern 26, the first spacer layer 30, the sacrificial spacer layer 32, the second spacer layer 34, the upper sacrificial pattern 58, the upper spacer layer 60, and the insulating pattern 42, which do not overlap the upper contact pattern 68. A bottom of the recessed part 71 may be formed between an upper surface and a lower surface of the insulating capping pattern 26.

A plurality of upper contact patterns 68 may be formed. Each of the plurality of upper contact patterns 68 may include a lower part 68a, an intermediate part 68b on the lower part 68a, and an upper part 68c on the intermediate part 68b.

The upper part 68c of the upper contact pattern 68 may be formed at a level higher than the interconnection structure 28, the lower part 68a thereof may be electrically connected to the intermediate contact pattern 64 and formed at a level lower than the bottom of the recessed part 71, and the intermediate part 68b thereof may be formed between the upper part 68c and the lower part 68a. The lower contact pattern 50, the intermediate contact pattern 64, and the upper contact pattern 68 may configure a contact structure 70.

Figure 17:
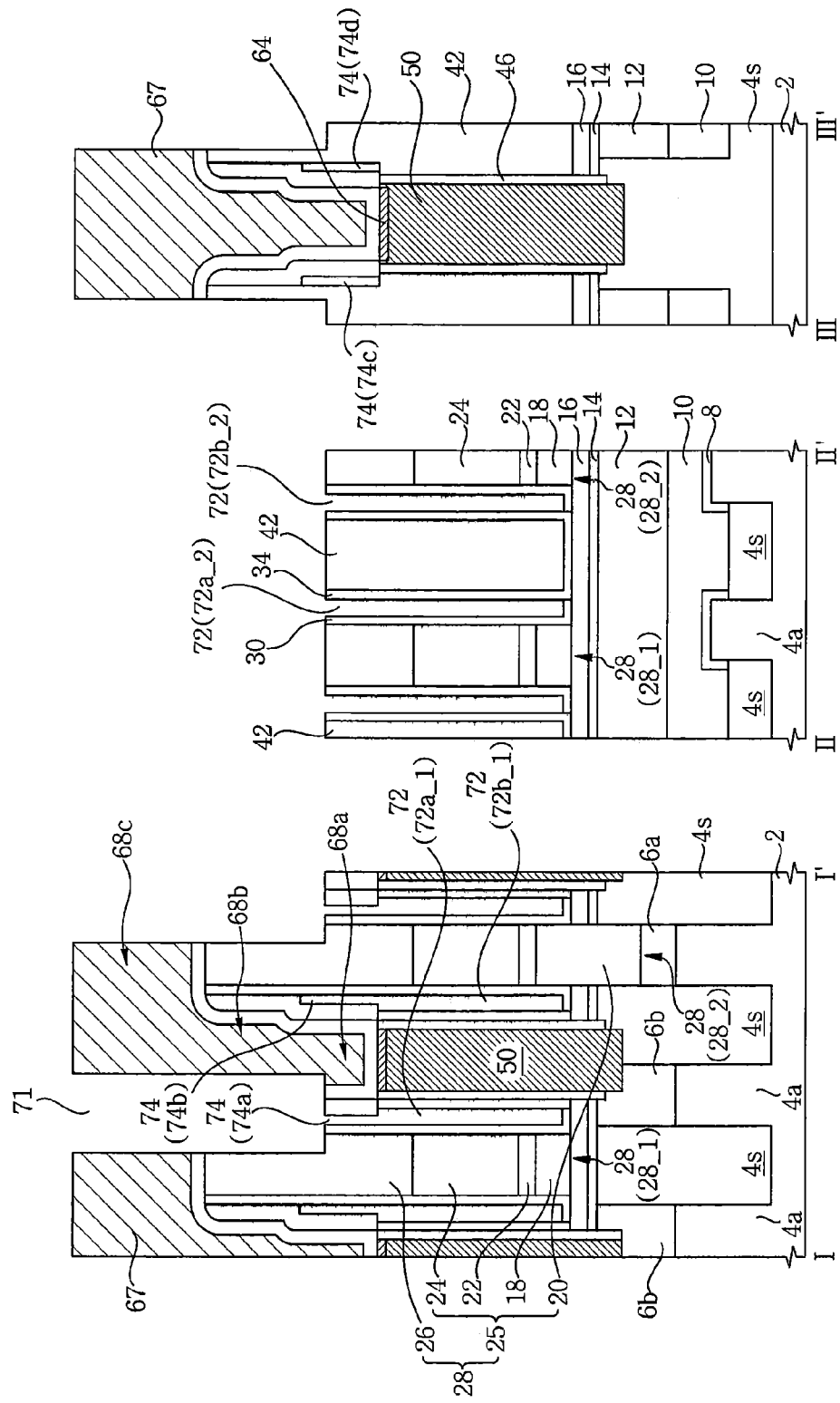

Referring to FIGS. 1, 2, and 17, the upper sacrificial pattern 58 and the sacrificial spacer layer 32 may be formed using the same material, for example, silicon oxide. The upper sacrificial pattern 58 and the sacrificial spacer layer 32 may be removed using an etching process. A wet etching process using a wet etching solution including hydrofluoric acid may be used as the etching process.

A part at which the upper sacrificial pattern 58 is removed may form an upper air spacer 74, and a part at which the sacrificial spacer layer 32 is removed may form a lower air spacer 72. The lower air spacer 72 and the upper air spacer 74 may be connected to each other. The upper air spacer 74 may serve as a path so that the wet etching solution may easily further reach the sacrificial spacer layer 32. Therefore, due to the upper air spacer 74 that may serve as the path through which the wet etching solution may move, a process of etching the sacrificial spacer layer 32 for forming the lower air spacer 72 may be more stably and reliably performed.

The lower air spacer 72 may include a plurality of lower air spacers having line shapes spaced apart from each other. The upper air spacer 74 may be formed in a ring shape. The upper air spacer 74 may be formed so as to surround side surfaces of the lower part 68a of the upper contact pattern 68.

Referring again to FIGS. 1, 2, and 3, an upper insulating layer 78 may be formed to fill the recessed part 71. The upper insulating layer 78 may be formed of, for example, silicon nitride.

Figure 18:
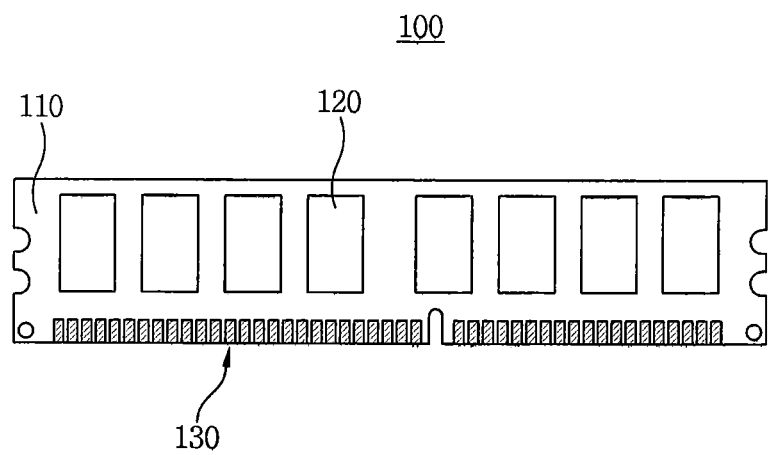
FIG. 18 is a view of a semiconductor module including a semiconductor device formed using a method according to example embodiments of the inventive concepts.

FIG. 18 is a view of a semiconductor module 100 including a semiconductor device formed using a method according to example embodiments of the inventive concepts.

Referring to FIG. 18, the semiconductor module 100 may be a memory module including a memory device. The semiconductor module 100 may include a module substrate 110, a plurality of semiconductor devices 120 disposed on the module substrate 110, and a plurality of terminals 130 arranged on one side of the module substrate 110. The terminals 130 may include a conductive metal. The terminals 130 may be electrically connected to the semiconductor devices 120.

The module substrate 110 may be a memory module substrate. The module substrate 110 may include a printed circuit board (PCB).

The semiconductor devices 120 may be memory devices. The semiconductor devices 120 may be, for example, DRAM devices. Each of the semiconductor devices 120 may be a semiconductor device according to example embodiments of the inventive concepts and/or a semiconductor package including a semiconductor device according to example embodiments of the inventive concepts.

Figure 19:
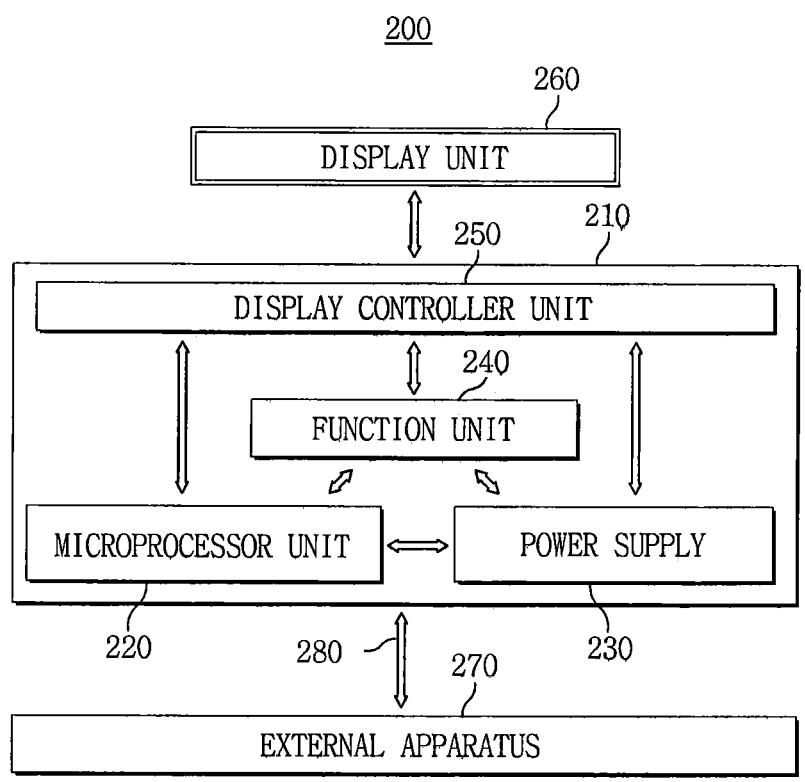
FIG. 19 is a block diagram of an electronic system including a semiconductor device formed using a method according to example embodiments of the inventive concepts.

FIG. 19 is a block diagram of an electronic system 200 including a semiconductor device formed using a method according to example embodiments of the inventive concepts.

Referring to FIG. 19, the electronic system 200 may include a body 210, a display unit 260, and an external apparatus 270. The body 210 may include a microprocessor unit 220, a power supply 230, a function unit 240, and/or a display controller unit 250. The body 210 may include a system board or a motherboard having a PCB or the like, and/or a case.

The microprocessor unit 220, the power supply 230, the function unit 240, and the display controller unit 250 may be mounted or disposed on an upper surface of the body 210 or inside the body 210. The display unit 260 may be disposed on the upper surface of the body 210 or inside/outside the body 210. The display unit 260 may display an image processed by the display controller unit 250. For example, the display unit 260 may include a liquid crystal display (LCD), active matrix organic light emitting diodes (AMOLED), or various display panels. The display unit 260 may include a touch screen. Therefore, the display unit 260 may have an input/output function.

The power supply 230 may supply a current or voltage to the microprocessor unit 220, the function unit 240, the display controller unit 250, etc. The power supply 230 may include a charging battery, a socket for a dry cell, or a voltage/current converter.

The microprocessor unit 220 may receive a voltage from the power supply 230 to control the function unit 240 and the display unit 260. For example, the microprocessor unit 220 may include a CPU or an application processor (AP). The function unit 240 may include a touch pad, a touch screen, a volatile/non-volatile memory, a memory card controller, a camera, a lighting, an audio and moving picture playback processor, a wireless radio antenna, a speaker, a microphone, a USB port, or a unit having other various functions. The function unit 240 may include a semiconductor device according to example embodiments of the inventive concepts.

Figure 20:
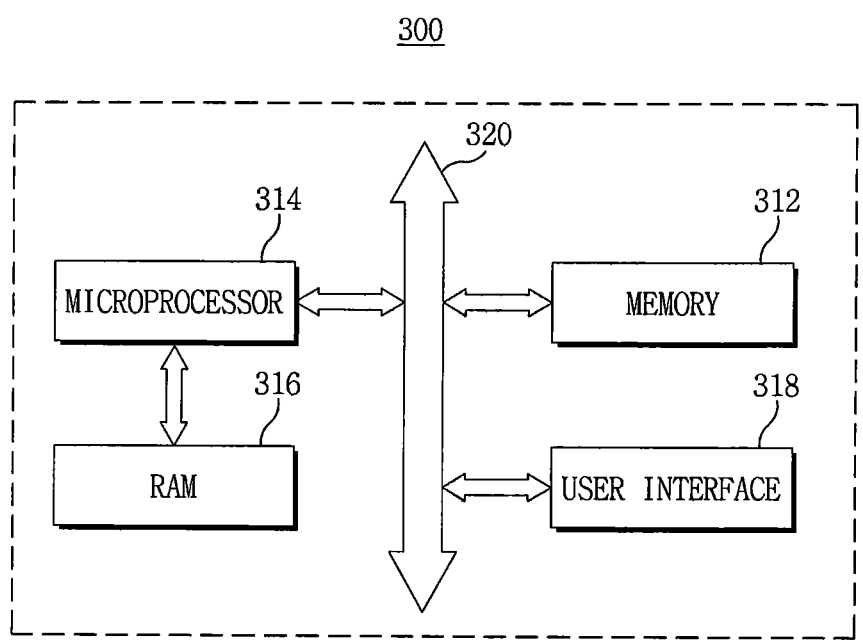
FIG. 20 is a block diagram of an electronic system including a semiconductor device formed using a method according to example embodiments of the inventive concepts.

FIG. 20 is a block diagram of an electronic system 300 including a semiconductor device formed using a method according to example embodiments of the inventive concepts.

Referring to FIG. 20, the electronic system 300 may include a semiconductor device according to example embodiments of the inventive concepts. The electronic system 300 may include a microprocessor 314, a memory system 312, and a user interface 318 which performs data communication using a bus 320. The microprocessor 314 may include a CPU or an AP. The electronic system 300 may further include a RAM 316 in direct communication with the microprocessor 314. The microprocessor 314 and/or the RAM 316 may be assembled within a single package. The user interface 318 may be used to input data to the electronic system 300, or output data from the electronic system 300. For example, the user interface 318 may include a touch pad, a touch screen, a keyboard, a mouse, a scanner, a voice detector, a cathode ray tube (CRT) monitor, an LCD, an AMOLED, a plasma display pad (PDP), a printer, a lighting, or various input/output devices. The memory system 312 may store operational codes of the microprocessor 314, data processed by the microprocessor 314, or data received from the outside. The memory system 312 may include a memory controller, a hard disk, or a solid state drive (SSD). The memory system 312 may include semiconductor devices according to example embodiments of the inventive concepts.

According to example embodiments of the inventive concepts, a semiconductor device that includes lower air spacers of line shapes and upper air spacers disposed on the lower air spacers and connected to the lower air spacers may be provided. The lower and upper air spacers may serve to reduce bit line loading capacitance in a memory device such as a DRAM, or the like, and thus a bit line sensing margin may be increased and performance of the semiconductor device may be improved.

The above-disclosed subject matter is to be considered illustrative, and not restrictive, and the appended claims are intended to cover all such modifications, enhancements, and other embodiments, which fall within the true spirit and scope of the inventive concepts. Thus, to the maximum extent allowed by law, the scope is to be determined by the broadest permissible interpretation of the following claims and their equivalents, and shall not be restricted or limited by the foregoing detailed description.

What is claimed is:

1. A semiconductor device comprising:
    a semiconductor substrate;
    a first interconnection structure and a second interconnection structure on the semiconductor substrate;
    a contact structure between the first and second interconnection structures;
    a first lower air spacer between the first interconnection structure and the contact structure;
    a second lower air spacer between the second interconnection structure and the contact structure and spaced apart from the first lower air spacer; and
    an upper air spacer on a side surface of the contact structure and connected to the first and second lower air spacers.

2. The device of claim 1, further comprising a first insulating pattern and a second insulating pattern between the first and second interconnection structures.

3. The device of claim 2, wherein the upper air spacer comprises a first part, a second part, a third part, and a fourth part, and wherein:
    the first part of the upper air spacer is disposed between the first interconnection structure and the contact structure and on the first lower, air spacer;
    the second part of the upper air spacer is disposed between the second interconnection structure and the contact structure and on the second lower air spacer;
    the third part of the upper air spacer is disposed between the first insulating pattern and the contact structure; and
    the fourth part of the upper air spacer is disposed between the second insulating pattern and the contact structure.

4. The device of claim 3, wherein the first part of the upper air spacer has a height different from a height of the second part of the upper air spacer.

5. The device of claim 3, wherein the third and fourth parts of the upper air spacer have heights greater than a height of the first part of the upper air spacer.

6. The device of claim 1, wherein:
    the first and second lower air spacers have line shapes extending in parallel; and
    the upper air spacer has a ring shape surrounding a part of the side surface of the contact structure.

7. The device of claim 1, wherein the contact structure comprises a lower contact pattern and an upper contact pattern on the lower contact pattern.

8. The device of claim 7, wherein:
    the first lower air spacer is disposed between the lower contact pattern of the contact structure and the first interconnection structure; and
    the second lower air spacer is disposed between the lower contact pattern of the contact structure and the second interconnection structure.

9. The device of claim 7, wherein the upper air spacer surrounds a side surface of a part of the upper contact pattern.

10. The device of claim 7, further comprising an upper spacer layer between the upper air spacer and the upper contact pattern.

11. A semiconductor device comprising:
    a semiconductor substrate;
    a first interconnection structure and a second interconnection structure on the semiconductor substrate and spaced apart from each other;
    insulating patterns between the first and second interconnection structures and spaced apart from each other;
    a contact structure between the first and second interconnection structures and between the insulating patterns;
    a first lower air spacer including a first part that is between the first interconnection structure and the contact structure and a second part that is between the insulating patterns and the first interconnection structure;
    a second lower air spacer including a first part that is between the second interconnection structure and the contact structure and a second part that is between the insulating patterns and the second interconnection structure; and
    an upper air spacer on the first part of the first lower air spacer and the first part of the second lower air spacer, the upper air spacer surrounding a part of a side surface of the contact structure.

12. The device of claim 11, wherein the upper air spacer is connected to the first part of the first lower air spacer and the first part of the second lower air spacer.

13. The device of claim 11, wherein each of the first and second lower air spacers has a width greater than a width of the upper air spacer.

14. The device of claim 11, wherein the first parts of the first and second lower air spacers have heights different from heights of the second parts of the first and second lower air spacers.

15. The device of claim 11, wherein the insulating patterns have parts that overlap the second parts of the first and second lower air spacers.

16. A semiconductor device comprising:
    a first interconnection structure and a second interconnection structure;
    insulating patterns between the first and second interconnection structures;
    a contact structure between the first and second interconnection structures and between the insulating patterns;
    a first lower air spacer between the first interconnection structure and the contact structure;
    a second lower air spacer between the second interconnection structure and the contact structure and spaced apart from the first lower air spacer; and
    an upper air spacer between the first and second interconnection structures and the contact structure and between the insulating patterns and the contact structure.

17. The device of claim 16, further comprising:
a first spacer layer between the first interconnection structure and the first lower air spacer and extending between the first interconnection structure and the upper air spacer; and
a second spacer layer between the first lower air spacer and the contact structure,
wherein the first and second spacer layers include an insulating material having a dielectric constant higher than air and including nitrogen.

18. The device of claim 16, further comprising an upper spacer layer between the upper air spacer and the contact structure.

19. The device of claim 16, wherein:
each of the first and second interconnection structures includes a conductive structure and an insulating capping pattern on the conductive structure; and
the contact structure includes a lower contact pattern, an intermediate contact pattern on the lower contact pattern, and an upper contact pattern on the intermediate contact pattern, wherein:
the lower contact pattern and the intermediate contact pattern are disposed between the first and second interconnection structures;
the upper contact pattern includes a lower part, an intermediate part on the lower part, and an upper part on the intermediate part;
the lower part of the upper contact pattern is electrically connected to the intermediate contact pattern;
the intermediate part of the upper contact pattern has a width less than a width of the lower part of the upper contact pattern; and
the upper part of the upper contact pattern is spaced apart from the first interconnection structure and overlaps the insulating capping pattern of the second interconnection structure.

20. The device of claim 16, further comprising:
a semiconductor substrate;
an isolation region in the semiconductor substrate and defining an active region;
a gate electrode buried in the active region and the isolation region;
a gate dielectric between the active region and the gate electrode;
a gate capping pattern on the gate electrode;
a first source/drain region and a second source/drain region in the active region on opposite sides of the gate capping pattern; and
an interlayer insulating layer on the active region, the isolation region, and the gate capping pattern,
wherein:
the first and second interconnection structures are disposed on the interlayer insulating layer;
one of the first and second interconnection structures passes through the interlayer insulating layer and comprises an interconnection contact pattern electrically connected to the first source/drain region; and
the contact structure is electrically connected to the second source/drain region.

* * * * *